United States Patent
Wu et al.

(10) Patent No.: US 11,067,893 B2
(45) Date of Patent: Jul. 20, 2021

(54) COMPOSITIONS AND PROCESSES FOR SELF-ASSEMBLY OF BLOCK COPOLYMERS

(71) Applicant: RIDGEFIELD ACQUISITION, Luxembourg (LU)

(72) Inventors: Hengpeng Wu, Hillsborough, NJ (US); JiHoon Kim, North Wales, PA (US); Jianhui Shan, Branchburg, NJ (US); Durairaj Baskaran, Bridgewater, NJ (US); Md S. Rahman, Flemington, NJ (US)

(73) Assignee: Merck Patent GMbH, Darmstadt (DE)

( * ) Notice: Subject to any disclaimer, the term of this patent is extended or adjusted under 35 U.S.C. 154(b) by 229 days.

(21) Appl. No.: 16/468,740

(22) PCT Filed: Dec. 19, 2017

(86) PCT No.: PCT/EP2017/083514
§ 371 (c)(1),
(2) Date: Jun. 12, 2019

(87) PCT Pub. No.: WO2018/114930
PCT Pub. Date: Jun. 28, 2018

(65) Prior Publication Data
US 2020/0019062 A1    Jan. 16, 2020

Related U.S. Application Data

(60) Provisional application No. 62/437,426, filed on Dec. 21, 2016.

(51) Int. Cl.
| | |
|---|---|
| *G03F 7/11* | (2006.01) |
| *C08F 112/08* | (2006.01) |
| *C09D 125/18* | (2006.01) |
| *G03F 7/00* | (2006.01) |
| *G03F 7/038* | (2006.01) |
| *G03F 7/16* | (2006.01) |
| *G03F 7/20* | (2006.01) |
| *G03F 7/32* | (2006.01) |
| *H01L 21/027* | (2006.01) |

(52) U.S. Cl.
CPC ............ *G03F 7/11* (2013.01); *C08F 112/08* (2013.01); *C09D 125/18* (2013.01); *G03F 7/0002* (2013.01); *G03F 7/038* (2013.01); *G03F 7/168* (2013.01); *G03F 7/2004* (2013.01); *G03F 7/322* (2013.01); *G03F 7/325* (2013.01); *C08F 2810/40* (2013.01); *H01L 21/0274* (2013.01)

(58) Field of Classification Search
CPC .............. G03F 7/11; C08F 112/08; C08F 2/38
See application file for complete search history.

(56) References Cited

U.S. PATENT DOCUMENTS

| | | |
|---|---|---|
| 3,161,630 A | 12/1964 | Auguste |
| 3,285,949 A | 11/1966 | Siebert |
| 3,474,054 A | 10/1969 | White |
| 3,919,077 A | 11/1975 | Whitehurst |
| 4,200,729 A | 4/1980 | Calbo |
| 4,251,665 A | 2/1981 | Calbo |
| 4,698,394 A | 10/1987 | Wong |
| 5,136,029 A | 8/1992 | Furukawa |

(Continued)

FOREIGN PATENT DOCUMENTS

| | | |
|---|---|---|
| CA | 1293090 C | 12/1991 |
| EP | 0227124 A2 | 7/1987 |

(Continued)

OTHER PUBLICATIONS

Akira Hirao et al, "Synthesis of Branched Polymers by Means of Living Anionic Polymerization. 12. Anionic Synthesis of Well-Defined Star-Branched Polymers by Using Chain-End-Functionalized Polystyrenes with Dendritic Benzyl Bromide Moieties", Macromolecules, vol. 35, No. 19, Aug. 16, 2002, pp. 7224-7231.

(Continued)

*Primary Examiner* — Mark S Kaucher
(74) *Attorney, Agent, or Firm* — Francis M. Houlihan

(57) ABSTRACT

The present invention relates to a novel styrenic polymer and to the novel composition comprised of this polymer and a solvent; wherein the styrenic polymer has a polydispersity from 1 to 1.3 and further wherein each polymer chain of the styrenic polymer is capped with one end group of structure 1), wherein, and L is a linking group selected from the group consisting of a direct valence bond, oxy (—O—), carbonyloxy, (—(C═O)—O—), carbonate (—O—(C═O)—O—); $L_2$ is a C-1 to C-20 substituted or unsubstituted alkylene spacer, an arylene spacer or a direct valence bond, R, is hydrogen, a halide, a C-1 to C-20 alkyl moiety, or a C-1 to C-20 alkyloxy moiety, m is an integer from 1 to 3; and (I) represent the direct valence bond attaching the end group 1) to the end of the polymer chain of the styrenic polymer. In another aspect of this invention it pertains to the use of this composition to create self-assembly process.

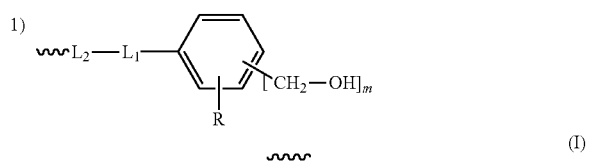

23 Claims, 2 Drawing Sheets

(56) References Cited

U.S. PATENT DOCUMENTS

| | | |
|---|---|---|
| 5,187,019 A | 2/1993 | Calbo |
| 5,446,125 A | 8/1995 | Honda |
| 5,674,662 A | 10/1997 | Szmanda |
| 5,929,204 A | 7/1999 | Noguchi |
| 6,512,020 B1 | 1/2003 | Asakura |
| 7,138,490 B2 | 11/2006 | Nakanishi |
| 7,264,329 B2 | 9/2007 | Kato |
| 7,471,614 B2 | 12/2008 | Frommer |
| 7,560,141 B1 | 7/2009 | Kim |
| 7,846,502 B2 | 12/2010 | Kim |
| 8,017,194 B2 | 9/2011 | Colburn |
| 8,226,838 B2 | 7/2012 | Cheng |
| 8,309,278 B2 | 11/2012 | Yang |
| 8,372,295 B2 | 2/2013 | Millward |
| 8,486,511 B2 | 7/2013 | Black |
| 8,486,512 B2 | 7/2013 | Black |
| 8,491,965 B2 | 7/2013 | Cheng |
| 8,568,958 B2 | 10/2013 | Yao |
| 8,686,109 B2 | 4/2014 | Yin |
| 8,691,925 B2 | 4/2014 | Wu |
| 8,795,539 B2 | 8/2014 | Lee |
| 8,835,581 B2 | 9/2014 | Wu |
| 8,999,492 B2 | 4/2015 | Millward |
| 9,040,659 B2 | 5/2015 | Yin |
| 9,052,598 B2 | 6/2015 | Wu |
| 9,086,621 B2 | 7/2015 | Wuister |
| 9,093,263 B2 | 7/2015 | Wu |
| 9,109,086 B2 | 8/2015 | Tang |
| 9,123,541 B2 | 9/2015 | Xu |
| 9,181,449 B2 | 11/2015 | Yi |
| 9,505,945 B2 | 11/2016 | Wu |
| 9,574,104 B1 | 2/2017 | Kim |
| 9,653,294 B2 | 5/2017 | Kim |
| 10,240,250 B2 | 3/2019 | Nguyen |
| 10,421,878 B2 | 9/2019 | Xu |
| 2004/0068071 A1 | 4/2004 | Hoff |
| 2004/0157948 A1 | 8/2004 | Schlueter |
| 2007/0276104 A1 | 11/2007 | Harruna |
| 2008/0299353 A1 | 12/2008 | Stoykovich |
| 2008/0318005 A1 | 12/2008 | Millward |
| 2009/0035668 A1 | 2/2009 | Breyta |
| 2009/0075002 A1 | 3/2009 | Kim |
| 2009/0087653 A1 | 4/2009 | Nealey |
| 2009/0092803 A1 | 4/2009 | Bita |
| 2009/0179002 A1 | 7/2009 | Cheng |
| 2009/0196488 A1 | 8/2009 | Nealey |
| 2009/0286927 A1 | 11/2009 | Sodergard |
| 2010/0124629 A1 | 5/2010 | Gopalan |
| 2011/0147984 A1 | 6/2011 | Cheng |
| 2012/0009390 A1 | 1/2012 | Yang |
| 2012/0103935 A1 | 5/2012 | Cheng |
| 2012/0273460 A1 | 11/2012 | Kang |
| 2012/0285929 A1 | 11/2012 | Matsumura |
| 2013/0012618 A1 | 1/2013 | Hiro |
| 2013/0240481 A1 | 9/2013 | Miyashita |
| 2013/0244439 A1 | 9/2013 | Ghariehali |
| 2013/0330668 A1 | 12/2013 | Wu |
| 2014/0154630 A1 | 6/2014 | Schmid |
| 2014/0202632 A1 | 7/2014 | Wang |
| 2014/0238956 A1 | 8/2014 | Namie |
| 2014/0335324 A1 | 11/2014 | Kim |
| 2014/0342290 A1 | 11/2014 | Wu |
| 2015/0050794 A1 | 2/2015 | Kim |
| 2015/0093912 A1 | 4/2015 | Wu |
| 2016/0122580 A1 | 5/2016 | Hong |

FOREIGN PATENT DOCUMENTS

| | | |
|---|---|---|
| EP | 1095711 A2 | 5/2001 |
| EP | 2606076 B1 | 12/2016 |
| GB | 715913 A | 9/1954 |
| JP | 58-225103 A2 | 12/1983 |
| JP | 2003048929 A | 2/2003 |
| JP | 2003238682 A | 8/2003 |
| JP | 2008088368 A | 4/2008 |
| JP | 2010260883 A | 11/2010 |
| JP | 2011018778 A | 1/2011 |
| WO | WO2008097736 A2 | 8/2008 |
| WO | WO2012022390 A1 | 2/2012 |
| WO | WO2012161106 A1 | 11/2012 |
| WO | WO2013050338 A1 | 4/2013 |
| WO | WO2013119832 A1 | 8/2013 |
| WO | WO2013156240 A1 | 10/2013 |

OTHER PUBLICATIONS

Anbanandam Parthiban et al., "AB- and ABC-type di- and triblock copolymers of poly[styrene- block-(ε-caprolactone]] and poly[styrene-block-(ε-caprolactone)-block-lactide]:synthesis, characterization and thermal studies", POLYMER Interarnational, Oct. 14, 2009, pp. 145-154.

Atsushi Hieno et al., "Quick Formation of DSA Neutralization Polymer Layer Attached by Reactive Self-Assembled Monolayer," J. Photopol Sci. Tech. vol. 25 No. 1, pp. 73-pp. 76 (2012).

Bokyung Kim et al., "Dewetting of PMMA on PS-Brush Substrates", Macromolecules vol. 42 No. 20, pp. 7919-pp. 7923 (2009).

Bong Hoon Kim et al.; The Synthesis of Randum Brush for Nanostructure of Block Copolymer, Macromol. Symp., vol. 249-250, pp. 303-pp. 306 (2007).

Bumjoon J. Kim et al., "Importance of End-Group Structure in Controlling the Interfacial Activity of Polymer-Coated Nanoparticles", Macromolecules vol. 40 No. 6, pp. 1796-pp. 1798 (2007).

C. T. Black et al., "Integration of self-assembled diblock copolymers for semiconductor capacitor fabrication," Applied Physics Letters vol. 79 No. 3, pp. 409-pp. 411 (2001).

Christopher N. Bates et al., "Single-and Dual-Component Cross-Linked Polymeric Surface Treatments for Controlling Block Copolymer Orientation", Polymer Preprints vol. 52(1), pp. 181-pp. 182 (2011).

Craig J. Hawker et al., "Facile Synthesis of Block Copolymers for Nanolithographic Applications", Polymer Preprints vol. 46 No. 2, pp. 239-pp. 248 (2005).

Caig J. Hawker et al., "Initiating Systems for Nitroxide-Mediated "Living" Free Radical Polymerizations: Synthesis and Evaluation", Macromolecules vol. 29 No. 16, pp. 5245-pp. 5254 (1996).

Du Yeol Ryu et al., "Cylindrical Microdomain Orientation of PS-b-PMMA on the Balanced Interfacial Interactions: Composition Effect of Block Copolymers," Macromolecules vol. 42 No. 13, pp. 4902-pp. 4906 (2009).

Du Yeol Ryu et al., "A Generalized Approach to the Modification of Solid Surfaces", Science vol. 308, pp. 236-pp. 239 (2005).

Du Yeol Ryu et al., "Surface Modification with Cross-Linked Random Copolymers: Minimum Effective Thickness", Macromolecules vol. 40 No. 12, pp. 4296-pp. 4300 (2007).

E. Huang et al., "Using Surface Active Random Copolymers to Control the Domain Orientation in Diblock Copolymer Thin Films", Macromolecules vol. 31 No. 22, pp. 7641-pp. 7650 (1998).

Eric Drockenmuller et al., "Covalent Stabilization of Nanostructures: Robust Block Copolymer Templates from Novel Thermoreactive Systems," Journal of Polymer Science: Part A: Polymer Chemistry, vol. 43, pp. 1028-pp. 1037 (2005).

Erik W. Edwards et. al., Macromolecules 2007, 40, p. 90-96.

Eungnak Han et al., "Photopatternable Imaging Layers for Controlling Block Copolymer Microdomain Orientation", Advanced Materials vol. 19, pp. 4448-pp. 4452 (2007).

G. J. Kellogg et al., "Observed Surface Energy Effects in Confined Diblock Copolymers", Physical Review Letters vol. 76 No. 14, pp. 2503-pp. 2506 (1996).

Shislain David et al., "Synthesis of α,ω-Phosphonate Polysterene Via Dead End Polymerization, Phosporus, Sulfur, and Silicon", Phosporus, Sulfur, and Silicon vol. 179 No. 12, pp. 2627-pp. 2634 (2004).

Hironobu Murata et al., "Synthesis of Functionalized Polymer Monolayers from Active Ester Brushes", Macromolecules vol. 40 No. 15, pp. 5497-pp. 5503 (2007).

Holger Merlitz, "Surface Instabilities of Monodisperse and Densely Grafter Polymer Brushes", Macromolecules vol. 41 No. 13, pp. 5070-pp. 5072 (2008).

(56) References Cited

OTHER PUBLICATIONS

Hui Liu et al., Random Poly(methyl methacrylate-co-styrene) Brushes by ATRP to Create Neutral Surfaces for Block Copolymer Self-Assembly, Macromol. Chem. Phys. vol. 213, pp. 108-pp. 115 (2012).
I. E. Serhatli, "Synthesis of hybrid liquid crystalline block copolymers by combination of cationic or promoted cationic and free-radical polymerizations", Polymer Bulletin vol. 34, pp. 539-pp. 546 (1995).
Iain E. Dunlop, "Interactions Between Polymer Brushes: Varying the Number of End-Attaching Groups", Macromol. Cherm. Phys. vol. 205, pp. 2443-pp. 2450 (2004).
Jaroslav Holoubek et al., Self-assembled structures in polysterene-block-polyisoprene-blend-polystyrene and polysterene-block-poly(methyl methacrylate)-blend-polysterene or -blend-poly(methyl metracrylate) in the strong segregation regime:, Sci vol. 60, pp. 635-pp. 646 (2010).
Joona Bang et al., "Facile Routes to Patterned Surface Neutralization Layers for Block Copolymer Lithography", Advanced Materials vol. 19, pp. 4552-pp. 4557 (2007).
Julie M. Leiston-Belanger et al., "A Thermal and Manufacture Approach to Stabilized Diblock Copolymer Templates", Macromolecules vol. 38 No. 18, pp. 7676-pp. 7683 (2005).
Karl O. Stuen et al., "Graphoepitaxial assembly of asymmetric ternary blends of block copolymers and homopolymers", Vanotechnology Vo. 21,I pp. 1-pp. 7 (2010).
Kazuo Sugiyama et al., "Preparation of surface-modified polysterene microspheres by an azo-initiator having analogous structure to the head group of phosphatidylcholine", Macromol. Chem. Phys. vol. 195, pp. 1341-pp. 1352 (1994).
Kenneth C. Caster, "Applications of Polymer Brushes and Other Surface-Attached Polymers", Polymer Brushes Part 17, pp. 331-370 (2004).
Koji Asakawa et al., "Nanopatterning with Microdomains of Block Copolymers using Reactive-Ion Etching Selectivity", Jpn. J. Appl. Phys. vol. 41 Part 1 No. 10, pp. 6112-pp. 6118 (2002).
Machine Language English Abstract and Translation of WO2012-161106 A1.
I Fallais, et al., "End-Capping of Polystyrene by Aliphatic Primary Amine by Derivatization of Precursor Hydroxyl End Group", Journal of Polymer Science: Part A: Polymer Chemistry, vol. 38, 1618-1629 (2000).
Yuanlie Yu et al., "The synthesis of novel fluorine-containing random polymer and application in modification of solid surfaces", Surface & Coatings Technology vol. 205, pp. 205-pp. 212 (2010.
Mao-Peng Lin et al., "Photocrosslinking of Polymers Containing Cationically Polymerizable Groups in the Side-Chain by Sulfonium Salts", Journal of Polymer Science Part A: Polymer Chemistry Vo. 30 Issue 5, pp. 933-pp. 936, (1992).
Massimo Lazzari et al., "Methods for the Alignment and the Large-scale Ordering of Block Copolymer Morphologies," Block Copolymers in Nanoscience, Edited by M. Lazzari, G. Liu, and S. Lecommandoux, Copyright© 2006 WILEY-VCH Verlag GmbH & Co., KGaA, Winheim, pp. 191-pp. 231.
Nancy A. Listigovers et al., "Narrow Polydispersity Diblock and Triblock Copolymers of Alkyl Acrylates by a "Living" Stable Free Radical Polymerization", Macromolecules vol. 29 No. 27, pp. 8992-pp. 8993 (1996).
Nathan D. Jamagin et al., "PS-b-PHOST as a High ? Block Copolymers for Directed Self Assembly: Optimnization of Underlayer and Solvent Anneal Processes", SPIE vol. 8680, pp. 86801X-1-pp. 86801X-10 (2013).
P. Mansky et al., "Controlling Polymer-Surface Interactions with Random Copolymer Brushes", Science Magazine vol. 275, pp. 1458-pp. 1460 (1997).
PCT International Search Report, PCT/EP2015/074993, dated Jan. 28, 2016.
PCT International Search Report, and Written Opinion, PCT/EP2017/083514, dated Mar. 6, 2018.
R. P. Quirk et al., "Thermoplastic Elastomers 2nd Edition", Hanser/Gardner Publications, pp. 74-pp. 78 (1996).
Ricardo Ruiz et al., "Density Multiplication and Improved Lithography by Directed Block Copolymer Assembly", Science Magazine vol. 321, pp. 936-pp. 939 (2008).
Shengxiang Ji et al., "Preparation of Neutral Wetting Brushes for Block Copolymer Films from Homopolymer Blends", Advanced Materials vol. 20, pp. 3054-pp. 3060 (2008).
Shengxiang Ji et al., "Three-dimensional Directed Assembly of Block Copolymers together with Two-dimensional Square and Rectangular Nanolithograpy", Adv. Mater. vol. 23, pp. 3692-pp. 3697 (2011).
Unyong Jeong et al., "Asymmetric Block Copolymers with Homopolymers: Routes to Multiple Length Scale Nanostructures", Adv. Mater. vol. 14 No. 4, pp. 274-pp. 276 (2002).
Yoojin Kim et al., "The Dramatic Effect of Architecture on the Self-Assembly of Block Copolymers at Interfaces", Langmuir vol. 21 No. 23, pp. 10444-pp. 10458 (2005).
Chen Xin, et al., "Synthesis of Hydroxyl-Terminated Polystyrene", Chinese Journal of Applied Chemistry 42, 22-5 1987.
Machine Language English Abstract from JPO of JP 58-225103 A.
Yoojin Kim et al., "Effect of Architecture on the Self-Assembly of Block Copolymers at Interfaces: Linear-nanoparticle vs. Linear AB Diblocks", Polymeric Materials: Science & Engineering Vo. 92, pp. 399-pp. 400 (2005).
Liu Bing, et al., "Synthesis of chloroacetyl oligomer as macroinitiator for ATRP", China Synthetic Rubber Industry, Jul. 15, 1998, 21(5):304.
T. Thum-Albrecht et al., "Ultrahigh-Density Nanowire Arrays Grown in Self-Assembled. Diblock Copolymer Templates", Science Vo. 290, pp. 2126-pp. 2129 (2000).
Thomas Smart et al., "Block copolymer nanostructures", Nanotoday vol. 3. No. 3-4, pp. 38-pp. 46 (Jun.-Aug. 2008).
Timothy E. Patten et al., "Atom Transfer Radical Polymerization and the Synthesis of Polymeric Materials", Adv. Mater. vol. 10 Issue 12, pp. 901-pp. 915 (1998).
Toru Yamaguchi et al., "Resist-Pattern Guided Self-Assembly of Symmetric Diblock Copolymer", Journal of Photopolymer Science and Technology vol. 19 No. 3, pp. 385-pp. 388 (2006).
Toru Yamaguchi et al., "Two-Dimentional Patterning of Flexible Designs with High Half-Pitch Resolution by Using Block Copolymer Lithography", Advanced Materials vol. 20, pp. 1684-pp. 1689 (2008).
Seungpyo Hong, et al., "Characterization and Physical Properties of Polymethylphenylsilsesquioxane (PMPSQ) and Hydroxyl-Functionalized Polystyrene (PS-OH) Hybrids", Journal of Applied Polymer Science, Vo. 90, 2801-2812 (2003).
MachineLanguageEnglishAbstractandTranslation_JP2003-238682A.
MachineLanguageEnglishAbstractandTranslation_JP2003-48929A.
MachineLanguageEnglishAbstractandTranslation_JP2008-088368A.
MachineLanguageEnglishAbstractandTranslation_JP2010-260883A.

COMPOSITIONS AND PROCESSES FOR SELF-ASSEMBLY OF BLOCK COPOLYMERS

This application is a United States National Stage Patent Application under 35 U.S.C. § 371 of International Patent Application No. PCT/EP2017/083514, filed Dec. 19, 2017, which claims priority to U.S. Provisional Patent Application No. 62/437,426, filed Dec. 21, 2016, the contents of each of which are being hereby incorporated herein by reference.

FIELD OF INVENTION

The invention relates to novel polymers, novel compositions and novel methods for using the novel compositions for aligning microdomains of directed self-assembling block copolymers (BCP). The compositions and processes are useful for fabrication of electronic devices.

BACKGROUND

Directed self-assembly of block copolymers is a method useful for generating smaller and smaller patterned features for the manufacture of microelectronic devices in which the critical dimensions (CD) of features on the order of nanoscale can be achieved. Directed self-assembly methods are desirable for extending the resolution capabilities of microlithographic technology. In a conventional lithography approach, ultraviolet (UV) radiation may be used to expose through a mask onto a photoresist layer coated on a substrate or layered substrate. Positive or negative photoresists are useful and these can also contain a refractory element such as silicon to enable dry development with conventional integrated circuit (IC) plasma processing. In a positive photoresist, UV radiation transmitted through a mask causes a photochemical reaction in the photoresist such that the exposed regions are removed with a developer solution or by conventional IC plasma processing. Conversely, in negative photoresists, UV radiation transmitted through a mask causes the regions exposed to radiation to become less removable with a developer solution or by conventional IC plasma processing. An integrated circuit feature, such as a gate, via or interconnect, is then etched into the substrate or layered substrate, and the remaining photoresist is removed. When using conventional lithographic exposure processes, the dimensions of features of the integrated circuit feature are limited. Further reduction in pattern dimensions are difficult to achieve with radiation exposure due to limitations related to aberrations, focus, proximity effects, minimum achievable exposure wavelengths and maximum achievable numerical apertures. The need for large-scale integration has led to a continued shrinking of the circuit dimensions and features in the devices. In the past, the final resolution of the features has been dependent upon the wavelength of light used to expose the photoresist, which has its own limitations. Direct assembly techniques, such as graphoepitaxy and chemoepitaxy using block copolymer imaging, are highly desirable techniques used to enhance resolution while reducing CD variation. These techniques can be employed to either enhance conventional UV lithographic techniques or to enable even higher resolution and CD control in approaches employing EUV, e-beam, deep UV or immersion lithography. The directed self-assembly block copolymer comprises a block of etch resistant copolymeric unit and a block of highly etchable copolymeric unit, which when coated, aligned and etched on a substrate give regions of very high density patterns. In the graphoepitaxy directed self-assembly method, the block copolymers self organizes around a substrate that is pre-patterned with conventional lithography (Ultraviolet, Deep UV, e-beam, Extreme UV (EUV) exposure source) to form repeating topographical features such as a line/space (L/S) or contact hole (CH) pattern. In an example of a L/S directed self-assembly array, the block copolymer can form self-aligned lamellar regions which can form parallel line-space patterns of different pitches in the trenches between pre-patterned lines, thus enhancing pattern resolution by sub-dividing the space in the trench between the topographical lines into finer patterns. For example, a diblock copolymer which is capable of microphase separation and comprises a block rich in carbon (such as styrene or containing some other element like Si, Ge, Ti) which is resistant to plasma etch, and a block which is highly plasma etchable or removable, can provide a high resolution pattern definition. Examples of highly etchable blocks can comprise monomers which are rich in oxygen and which do not contain refractory elements, and are capable of forming blocks which are highly etchable, such as methylmethacrylate. The plasma etch gases used in the etching process of defining the self-assembly pattern typically are those used in processes employed to make integrated circuits (IC). In this manner very fine patterns can be created in typical IC substrates than were definable by conventional lithographic techniques, thus achieving pattern multiplication. Similarly, features such as contact holes can be made denser by using graphoepitaxy in which a suitable block copolymer arranges itself by directed self-assembly around an array of contact holes or posts defined by conventional lithography, thus forming a denser array of regions of etchable and etch resistant domains which when etched give rise to a denser array of contact holes. Consequently, graphoepitaxy has the potential to offer both pattern rectification and pattern multiplication.

In chemical epitaxy or pinning chemical epitaxy (a.k.a. chemoepitaxy) the self-assembly of the block copolymer is formed around a surface that has regions of differing chemical affinity but no or very slight topography to guide the self-assembly process. For example, the surface of a substrate could be patterned with conventional lithography (UV, Deep UV, e-beam EUV) to create surfaces of different chemical affinity in a line and space (L/S) pattern in which exposed areas whose surface chemistry had been modified by irradiation alternate with areas which are unexposed and show no chemical change. These areas present no topographical difference, but do present a surface chemical difference or pinning to direct self-assembly of block copolymer segments. Specifically, the directed self-assembly of a block copolymer whose block segments contain etch resistant (such as styrene repeat unit) and rapidly etching repeat units (such as methyl methacrylate repeat units) would allow precise placement of etch resistant block segments and highly etchable block segments over the pattern. This technique allows for the precise placement of these block copolymers and the subsequent pattern transfer of the pattern into a substrate after plasma or wet etch processing. Chemical epitaxy has the advantage that it can be fined tuned by changes in the chemical differences to help improve line edge roughness and CD control, thus allowing for pattern rectification. Other types of patterns such as repeating contact holes (CH) arrays could also be pattern rectified using chemoepitaxy.

Neutral layers are layers on a substrate, or the surface of a treated substrate, which have no affinity for either of the block segment of a block copolymer employed in directed self-assembly. In the graphoepitaxy method of directed self-assembly of block copolymer, neutral layers are useful as they allow the proper placement or orientation of block polymer segments for directed self-assembly which leads to proper placement of etch resistant block polymer segments and highly etchable block polymer segments relative to the substrate. For instance, in surfaces containing line and space features which have been defined by conventional radiation lithography, a neutral layer allows block segments to be oriented so that the block segments are oriented perpendicular to the surface of the substrates, an orientation which is ideal for both pattern rectification and pattern multiplication depending on the length of the block segments in the block copolymer as related to the length between the lines defined by conventional lithography. If a substrate interacts too strongly with one of the block segments it would cause it to lie flat on that surface to maximize the surface of contact between the segment and the substrate; such a surface would perturb the desirable perpendicular alignment which can be used to either achieve pattern rectification or pattern multiplication based on features created through conventional lithography. Modification of selected small areas or pinning of substrate to make them strongly interactive with one block of the block copolymer and leaving the remainder of the surface coated with the pinning layer can be useful for forcing the alignment of the domains of the block copolymer in a desired direction, and this is the basis for the pinned chemoepitaxy or graphoepitaxy employed for pattern multiplication.

One problem with current methods in chemoepitaxy directing layers employing a pinning layer is the ability to form with conventional brush precursors on substrates such as Si or $SiO_2$ a uniform and dense film over large areas. The formation of such dense films of a directing layer would be advantageous in more effectively forming perpendicular morphologies of block copolymer domains during the self-assembly of an overlying block copolymer containing styrenic and aliphatic blocks. Non-limiting examples of such block copolymers are those containing blocks of methyl methacrylate and blocks of styrene. We disclose herein novel styrenic graftable polymers which contain a benzylic alcohol end group moiety and have low polydispersity ranging from 1 to about 1.3. These new material are capable when coated from a formulation comprised of a solvent and baked of forming a surprisingly dense and uniform grafted layers. These densely grafted layer give surprisingly effective pinning layers in which perpendicular orientation of domains for block copolymer containing styrenic and aliphatic block occurs during chemoepitaxy directed self-assembly. When used in conjunction with graftable, crosslinking, or crosslinking and graftable neutral layer precursors these new pinning layer precursors surprisingly allow access to chemoepitaxy directed self-assembly schemes in which small nanometer sized patterns containing neutral layer and pinning layer can affect chemoepitaxy directed self-assembly, but at the same time, also allow for the creation of large unpatterned areas of the substrate only coated with a pinning layer. This allows for no perpendicular orientation of the block polymer domains in these areas which would otherwise give rise to undesirable defect creating during pattern transfer into the substrate during etching.

SUMMARY OF THE INVENTION

In two of its aspects, the present invention relates to a novel styrenic polymer and to the novel composition comprised of this polymer and a solvent; wherein the styrenic polymer has a polydispersity from 1 to 1.3 and further wherein each polymer chain of the styrenic polymer is capped with one end group of structure 1);

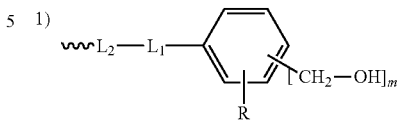

and further wherein $L_1$ is a linking group selected from the group consisting of a direct valence bond, oxy (—O—), carbonyloxy, (—(C=O)—O—), carbonate (—O—(C=O)—O—); $L_2$ is a C-1 to C-20 substituted or unsubstituted alkylene spacer, an arylene spacer or a direct valence bond, R is selected from hydrogen, a halide, a C-1 to C-20 alkyl moiety, or a C-1 to C-20 alkyloxy moiety, m is an integer from 1 to 3; and ⌇⌇⌇ represent the direct valence bond attaching the end group 1) to the end of the polymer chain of the styrenic polymer. In another aspect this invention pertains to the use of this composition to create a grafted film on a substrate, and in a further aspect this grafted film may be used in a directed self-assembly process.

Figure 1:
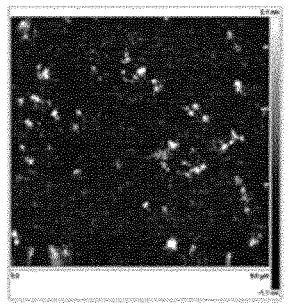
FIG. 1: Shows AFM images of polystyrene brush treated Si and $SiO_2$ surfaces.
Figure 1:
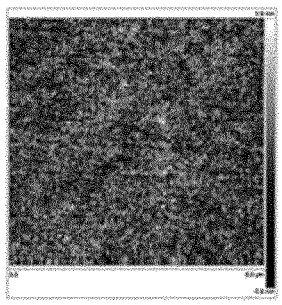
Figure 1:
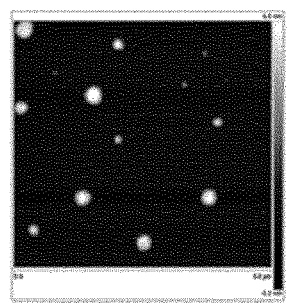
Figure 1:
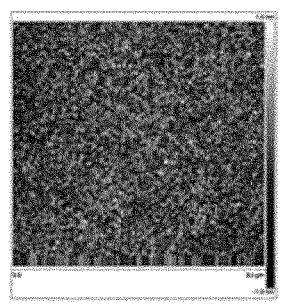

1 *a*) Comparative Example 1 grafted on Si substrate; 1 *b*) Synthesis Example 2 grafted on Si substrate; 1 *c*) Comparative Synthesis Example 2 grafted on $SiO_2$ substrate; 1 *d*) Synthesis Example 2 grafted on $SiO_2$ substrate.

FIG. 2: Shows Self-assembly morphology of PS-b-PMMA (Lo=30 nm) film on polystyrene brush treated substrates; 2A: "Comparative Synthesis Example 2," 2B: "Synthesis Example 2."

DETAILED DESCRIPTION

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms such as "includes" and "included", is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

Herein, alkyl refers to hydrocarbon groups which can be linear, branched (e.g. methyl, ethyl, propyl, isopropyl, tert-butyl and the like) or cyclic (e.g. cyclohexyl, cyclopropyl, cyclopentyl and the like).

Alkyloxy refers to an alkyl group as defined above on which is attached through an oxy (—O—) moiety (e.g. methoxy, ethoxy, propoxy, butoxy, 1,2-isopropoxy, cyclopentyloxy cyclohexyloxy and the like).

Fluoroalkyl refers to a linear, cyclic or branched saturated alkyl group as defined above in which the hydrogens have been replaced by fluorine either partially or fully (e.g. trifluoromethyl, pefluoroethyl, 2,2,2-trifluoroethyl, prefluoroisopropyl, perfluorocyclohexyl and the like).

Fluoroalkyloxy refers to a fluoroalkyl group as defined above on which is attached through an oxy (—O—) moiety (e.g. trifluoromethyoxy, perfluoroethyloxy, 2,2,2-trifluoroethoxy, perfluorocyclohexyloxy and the like).

Herein when referring to an alkyl, alkyloxy, fluoroalkyl, fluoroalkyloxy moieties with a possible range carbon atoms which starts with C-1 such as for instance "C-1 to C-10 alkyl," or "C-1 to C-10 fluoroalkyl," as a non-limiting examples, this range encompasses linear alkyls, alkyloxy, fluoroalkyl and fluoroalkyloxy starting with C-1 but only designated branched alkyls, branched alkyloxy, cycloalkyl, cycloakyloxy, branched fluoroalkyl, and cyclic fluoroalkyl starting with C-3.

Herein the term alkylene refers to hydrocarbon groups which can be a linear, branched or cyclic which has two attachment points (e.g. methylene, ethylene, 1,2-isopropylene, a 1,4-cyclohexylene and the like). Here again, when designating a possible range of carbons, such as C-1 to C-20, as a non-limiting example, this range encompasses linear alkylenes starting with C-1 but only designates branched alkylenes, or branched cycloalkylene starting with C-3. The term alkylene also encompasses unsubstituted alkylene (a.k.a. linear branched or cyclic alkylene with only hydrogen present), and substituted alkylenes (a.k.a. linear branched or cyclic alkylenes containing these substituents other than hydrogen), wherein these substituted alkylenes are ones wherein one or more hydrogens is replaced by a substituent selected from an aryl group, a halide, a C-1 to C-20 alkyl, or a C-1 to C-20 alkyloxy.

Herein the term aryl refers to aromatic hydrocarbon moiety which has one attachment points, this moiety may be a single benzene moiety (e.g. phenyl), a polycyclic aromatic moiety with one attachment points such derived from naphthalene, anthracene, pyrene and the like, or a multiple benzene rings in a chain which have one attachment point (e.g. 1,4-biphenyl). The term aryl also encompasses the aforementioned moieties which are unsubstituted aryls (a.k.a. only hydrogen as substituents) or which are substituted aryls, wherein the substituent is a substituent selected from a halide, a C-1 to C-20 alkyl, or a C-1 to C-20 alkyloxy.

Herein the term arylene refers to aromatic hydrocarbon moiety which has two attachment points, this moiety may be a single benzene moiety (e.g. 1,4-phenylene, 1,3-phenylene and 1,2-phenylene), a polycyclic aromatic moiety with two attachment points such derived from naphthalene, anthracene, pyrene and the like, or a multiple benzene rings in a chain which have two attachment point (e.g. biphenylene).

Lo is the block copolymer, bulk repeat period, as defined in Erik W. Edwards et. al., Macromolecules 2007, 40, p 90-96.

If two linking moieties are adjacent to each other and both are designated as a single valence bond this designation represents a single linking moiety which is a single valence bond (e.g. if linking moieties $L_1$ and $L_2$ are both designated as a single valence bonds, this represents a single linking moiety which is a single valence bond).

The first embodiment of is a styrenic polymer having a polydispersity from 1 to about 1.3 and further wherein each polymer chain of the styrenic polymer is capped with one end group having structure 1);

1)
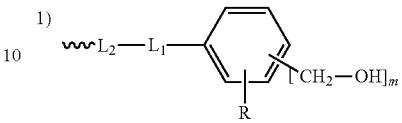

wherein $L_1$ is a linking group selected from the group consisting of a direct valence bond, oxy (—O—), carbonyloxy, (—(C=O)—O—), carbonate (—O—(C=O)—O—); $L_2$ is a C-1 to C-20 substituted or unsubstituted alkylene spacer, an arylene spacer or a direct valence bond, R is hydrogen, a halide, a C-1 to C-20 alkyl moiety, or a C-1 to C-20 alkyloxy moiety, m is 1 to 3; and ⌇⌇ represent the direct valence bond attaching the end group 1) to the end of the polymer chain of the styrenic polymer.

In another embodiment of the above embodiment of the styrenic polymer with the end group having structure 1), one of either moiety $L_1$ or $L_2$, is not selected from a direct valence bond.

In another embodiment of the above embodiment of the styrenic polymer with the end group having structure 1), m is 1 or 2.

In another embodiment of the above embodiment of the styrenic polymer with the end group having structure 1), m is 1.

In another embodiment of the above embodiment of the styrenic polymer with the end group having structure 1), m is 2.

In another embodiment of the above embodiment of the styrenic polymer with the end group having structure 1), m is 3.

In another embodiment of any of the above embodiments of the styrenic polymer it has the end group has structure 1a)

1a)
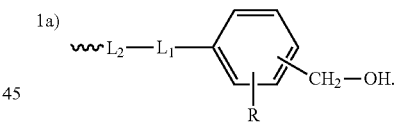

In another embodiment of any of the above embodiments of the styrenic polymer it has the end group has structure 1b)

1b)
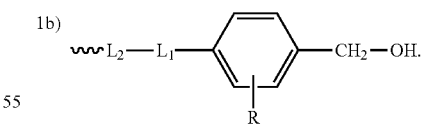

In another embodiment of any one of the above embodiments with the end group having structure 1), 1a) or 1b) of the styrenic polymer, $L_1$ is a direct valence bound.

In another embodiment of any one of the above embodiments of the styrenic polymer, with the end group having structure 1), 1a) or 1b), $L_1$ is oxy(—O—).

In another embodiment of any one of the above embodiments of the styrenic polymer, with the end group having structure 1), 1a) or 1b), $L_1$ is carbonyloxy, (—(C=O)—O—).

In another embodiment of any one of the above embodiments of the styrenic polymer, with the end group having structure 1), 1a) or 1b), $L_1$ is carbonate (—O—(C=O)—O—).

In another embodiment of any one of the above embodiments of the styrenic polymer, with the end group having structure 1), 1a) or 1b), $L_2$ is a C-1 to C-20 substituted or unsubstituted alkylene spacer.

In another embodiment of any one of the above embodiments of the styrenic polymer, with the end group having structure 1), 1a) or 1b), $L_2$ is a C-1 to C-20 unsubstituted alkylene spacer.

In another embodiment of any one of the above embodiments of the styrenic polymer, with the end group having structure 1), 1a) or 1b) $L_2$ is a C-1 to C-20 substituted alkylene spacer.

In another embodiment of any one of the above embodiments of the styrenic polymer, with the end group having structure 1), 1a) or 1b), $L_2$ is an arylene spacer.

In another embodiment of any one of the above embodiments of the styrenic polymer, with the end group having structure 1), 1a) or 1b), $L_2$ is a direct valence bond.

In another embodiment of any one of the above embodiments of the styrenic polymer, with the end group having structure 1), 1a) or 1b), R is hydrogen.

In another embodiment of any one of the above embodiments of the styrenic polymer, with the end group having structure 1), 1a) or 1b), R is a halide.

In another embodiment of any one of the above embodiments of the styrenic polymer, with the end group having structure 1), 1a) or 1b), $L_2$ is a C-1 to C-20 alkylene spacer, $L_1$ is oxy(—O—), and R is hydrogen.

In another embodiment of any one of the above embodiments of the styrenic polymer, with the end group having structure 1), 1a) or 1b), $L_2$ is a C-2 alkylene spacer.

In another embodiment of any one of the above embodiments of the styrenic polymer, with the end group having structure 1), 1a) or 1b), $L_2$ is a C-2 alkylene spacer, $L_1$ is oxy(—O—), and R is hydrogen.

In another embodiment of any one of the above embodiments of the styrenic polymer, with the end group having structure 1), 1a) or 1b), where R is a halide, this halide may be selected from the group consisting of F, Cl, Br or I. In another aspect of this embodiment the halide is F, in another the halide is Cl, in another the halide is Br in yet another the halide is I.

In another embodiment of any one of the above embodiments of the styrenic polymer, with the end group having structure 1), 1a) or 1b), where R is a C-1 to C-20 alkyl moiety. In other aspect of this embodiment, R is a C-1 to C-15 alkyl moiety, R is a C-1 to C-10 alkyl moiety, R is a C-1 to C-5 alkyl moiety, R is a C-1 to C-4 alkyl moiety, R is a C-1 to C-3 alkyl moiety, R is a C-1 to C-2 alkyl moiety or R is a C-1 alkyl moiety.

In another embodiment of any one of the above embodiments of the styrenic polymer, with the end group having structure 1), 1a) or 1b), where R is a C-1 to C-20 alkyloxy moiety. In other aspect of this embodiment, R is a C-1 to C-15 alkyloxy moiety, R is a C-1 to C-10 alkyloxy moiety, R is a C-1 to C-5 alkyloxy moiety, R is a C-1 to C-4 alkyloxy moiety, R is a C-1 to C-3 alkyloxy moiety, R is a C-1 to C-2 alkyloxy moiety or R is a C-1 alkyloxy moiety.

In another embodiment of any one of the above embodiments of the styrenic polymer with the end group having structure 1), 1a) or 1b), it has the more specific structure 1c)

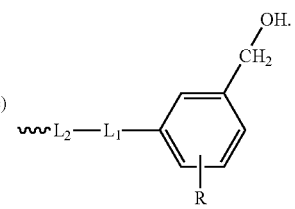

In another embodiment of any one of the above embodiments of the styrenic polymer, wherein the end group has structure 1c), $L_1$ is a direct valence bound.

In another embodiment of any one of the above embodiments of the styrenic polymer, wherein the end group has structure 1c), $L_1$ is oxy(—O—).

In another embodiment of any one of the above embodiments of the styrenic polymer, wherein the end group has structure 1c), $L_1$ is carbonyloxy, (—(C=O)—O—).

In another embodiment of any one of the above embodiments of the styrenic polymer, wherein the end group has structure 1c), $L_1$ is carbonate (—O—(C=O)—O—).

In another embodiment of any one of the above embodiments of the styrenic polymer, wherein the end group has structure 1c), $L_1$ is carbonate (—O—(C=O)—O—).

In another embodiment of any one of the above embodiments of the styrenic polymer, wherein the end group has structure 1c), $L_2$ is$_2$ is a C-1 to C-20 substituted or unsubstituted alkylene spacer.

In another embodiment of any one of the above embodiments of the styrenic polymer, wherein the end group has structure 1c), $L_2$ is$_2$ is a C-1 to C-20 unsubstituted alkylene spacer.

In another embodiment of any one of the above embodiments of the styrenic polymer, wherein the end group has structure 1c), $L_2$ is$_2$ is a C-1 to C-20 substituted alkylene spacer.

In another embodiment of any one of the above embodiments of the styrenic polymer, wherein the end group has structure 1c), $L_2$ is$_2$ is an arylene spacer.

In another embodiment of any one of the above embodiments of the styrenic polymer, wherein the end group has structure 1c), $L_2$ is$_2$ is a direct valence bond.

In another embodiment of any one of the above embodiments of the styrenic polymer, wherein the end group has structure 1c), R is hydrogen.

In another embodiment of any one of the above embodiments of the styrenic polymer, wherein the end group has structure 1c), R is a halide.

In another embodiment of any one of the above embodiments of the styrenic polymer, wherein the end group has structure 1c), R is a C-1 to C-20 alkyl moiety.

In another embodiment of any one of the above embodiments of the styrenic polymer, wherein the end group has structure 1c), R is a C-1 to C-20 alkyloxy moiety.

In another embodiment of any one of the above embodiments of the styrenic polymer, wherein the end group has structure 1c), $L_2$ is a C-1 to C-20 alkylene spacer, $L_1$ is oxy(—O—), and R is hydrogen.

In another embodiment of any one of the above embodiments of the styrenic polymer, wherein the end group has structure 1c), $L_2$ is a C-2 alkylene spacer.

In another embodiment of any one of the above embodiments of the styrenic polymer, wherein the end group has structure 1c), $L_1$ is oxy(—O—).

In another embodiment of any one of the above embodiments of the styrenic polymer, wherein the end group has structure 1c), R is hydrogen.

In another embodiment of any one of the above embodiments of the styrenic polymer, wherein the end group has structure 1c), $L_2$ is a C-2 alkylene spacer, $L_1$ is oxy(—O—), and R is hydrogen.

In another embodiment of any one of the above embodiments of the styrenic polymer, wherein the end group has structure 1c), R is hydrogen.

In another embodiment of any one of the above embodiments of the styrenic polymer, wherein the end group has structure 1c), R is a halide, this halide may be selected from the group consisting of F, Cl, Br or I. In another aspect of this embodiment the halide is F, in another the halide is Cl, in another the halide is Br in yet another the halide is I.

In another embodiment of any one of the above embodiments of the styrenic polymer, wherein the end group has structure 1c), R is a C-1 to C-20 alkyl moiety. In other aspect of this embodiment, R is a C-1 to C-15 alkyl moiety, R is a C-1 to C-10 alkyl moiety, R is a C-1 to C-5 alkyl moiety, R is a C-1 to C-4 alkyl moiety, R is a C-1 to C-3 alkyl moiety, R is a C-1 to C-2 alkyl moiety or R is a C-1 alkyl moiety.

In another embodiment of any one of the above embodiments of the styrenic polymer, wherein the end group has structure 1c), R is a C-1 to C-20 alkyloxy moiety. In other aspect of this embodiment, R is a C-1 to C-15 alkyloxy moiety, R is a C-1 to C-10 alkyloxy moiety, R is a C-1 to C-5 alkyloxy moiety, R is a C-1 to C-4 alkyloxy moiety, R is a C-1 to C-3 alkyloxy moiety, R is a C-1 to C-2 alkyloxy moiety or R is a C-1 alkyloxy moiety.

In another embodiment of any one of the above embodiments of the styrenic polymer, wherein the end group has structure 1c), $L_2$ is a C-1 to C-20 alkylene spacer, $L_1$ is oxy(—O—) and R is hydrogen.

In another embodiment of any one of the above embodiments of the styrenic polymer, wherein the end group has structure 1c), $L_2$ is a C-2 alkylene spacer. In another aspect of this embodiment R is hydrogen.

In another embodiment of any one of the above embodiments of the styrenic polymer, wherein the end group has structure 1c), R is hydrogen.

In another embodiment of any one of the above embodiments of the styrenic polymer, wherein the end group has structures 1), 1a), 1b) or 1c), $L_2$ is a C-1 to C-20 alkylene spacer which is substituted with an aryl group.

In another embodiment of any one of the above embodiments of the styrenic polymer, wherein the end group has structures 1), 1a), 1b) or 1c), $L_1$ is a direct valence bond and $L_2$ is a C-1 to C-20 alkylene spacer which is substituted with an aryl group. In a further aspect of this embodiment the end group has structure 2), wherein $L_3$ is a C-1 to C-19 alkylene group, R' and R" are independently selected from hydrogen, a halide, a C-1 to C-20 alkyl moiety, or a C-1 to C-20 alkyloxy moiety, and m' is an integer equal from 1 to 3 and 〰 represent the direct valence bond attaching, the end group 2), to the end of the polymer chain of the styrenic polymer.

2)

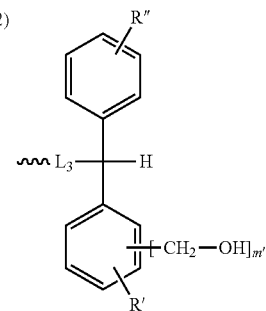

In another embodiment of any one of the above embodiments of the styrenic polymer, wherein the end group has structure 2), $L_3$ is a C-1 to C-5 alkylene moiety.

In another embodiment of any one of the above embodiments of the styrenic polymer, wherein the end group has structure 2), $L_3$ is a C-1 to C-2 alkylene moiety.

In another embodiment of any one of the above embodiments of the styrenic polymer, wherein the end group has structure 2), $L_3$ is a C-1 alkylene moiety.

In another embodiment of any one of the above embodiments of the styrenic polymer, wherein the end group has structure 2), m' is 1.

In another embodiment of any one of the above embodiments of the styrenic polymer, wherein the end group has structure 2), m' is 2.

In another embodiment of any one of the above embodiments of the styrenic polymer, wherein the end group has structure 2), m' is 3.

In another embodiment of any one of the above embodiments of the styrenic polymer, wherein the end group has structure 2), m' is 1 or 2.

In another embodiment of any one of the above embodiments of the styrenic polymer, wherein the end group has structure 2), R' is hydrogen.

In another embodiment of any one of the above embodiments of the styrenic polymer, wherein the end group has structure 2), R' is a halide.

In another embodiment of any one of the above embodiments of the styrenic polymer, wherein the end group has structure 2), R' is a C-1 to C-20 alkyl moiety.

In another embodiment of any one of the above embodiments of the styrenic polymer, wherein the end group has structure 2), R' is a C-1 to C-20 alkyloxy moiety.

In another embodiment of any one of the above embodiments of the styrenic polymer, wherein the end group has structure 2), R" is hydrogen.

In another embodiment of any one of the above embodiments of the styrenic polymer, wherein the end group has structure 2), wherein R" is a halide.

In another embodiment of any one of the above embodiments of the styrenic polymer, wherein the end group has structure 2), R" is a C-1 to C-20 alkyl moiety.

In another embodiment of any one of the above embodiments of the styrenic polymer, wherein the end group has structure 2), R" is a C-1 to C-20 alkyloxy moiety.

In another embodiment of any one of the above embodiments of the styrenic polymer, wherein the end group has structure 2), R' and R" both selected from the same substituent chosen from hydrogen, a halide, a C-1 to C-20 alkyl moiety, or a C-1 to C-20 alkyloxy moiety.

In another embodiment of any one of the above embodiments of the styrenic polymer, wherein the end group has structure 2), R' and R" are hydrogen.

In another embodiment of any one of the above embodiments of the styrenic polymer, wherein the end group has structure 2), this end group has the following more specific structure 2a) wherein $L_3$ is a C-1 to C-19 alkylene group, R' and R" are independently selected from hydrogen, a halide, a C-1 to C-20 alkyl moiety, or a C-1 to C-20 alkyloxy moiety; and m' is an integer from 1 to 3; and ∿∿ represent the direct valence bond attaching, the end group 2a), to the end of the polymer chain of the styrenic polymer:

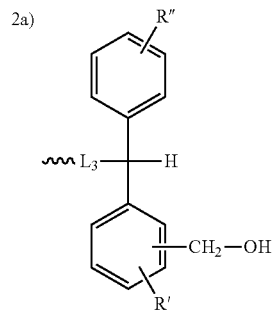

2a)

In another embodiment of any one of the above embodiments of the styrenic polymer, wherein the end group has structure 2a), $L_3$ is a C-1 to C-5 alkylene moiety.

In another embodiment of any one of the above embodiments of the styrenic polymer, wherein the end group has structure 2a), $L_3$ is a C-1 to C-2 alkylene moiety.

In another embodiment of any one of the above embodiments of the styrenic polymer, wherein the end group has structure 2a), $L_3$ is a C-1 alkylene moiety.

In another embodiment of any one of the above embodiments of the styrenic polymer, wherein the end group has structure 2a), R' is hydrogen.

In another embodiment of any one of the above embodiments of the styrenic polymer, wherein the end group has structure 2a), R' is a halide.

In another embodiment of any one of the above embodiments of the styrenic polymer, wherein the end group has structure 2a), R' is a C-1 to C-20 alkyl moiety.

In another embodiment of any one of the above embodiments of the styrenic polymer, wherein the end group has structure 2a), R' is a C C-1 to C-20 alkyloxy moiety.

In another embodiment of any one of the above embodiments of the styrenic polymer, wherein the end group has structure 2a), R" is hydrogen.

In another embodiment of any one of the above embodiments of the styrenic polymer, wherein the end group has structure 2a), R" is a halide.

In another embodiment of any one of the above embodiments of the styrenic polymer, wherein the end group has structure 2a), R" is a C-1 to C-20 alkyl moiety.

In another embodiment of any one of the above embodiments of the styrenic polymer, wherein the end group has structure 2a), R" is a C-1 to C-20 alkyloxy moiety.

In another embodiment of any one of the above embodiments of the styrenic polymer, wherein the end group has structure 2a), R' and R" both selected from the same substituent chosen from hydrogen, a halide, a C-1 to C-20 alkyl moiety, or a C-1 to C-20 alkyloxy moiety.

In another embodiment of any one of the above embodiments of the styrenic polymer, wherein the end group has structure 2a), R' and R" are hydrogen.

In another embodiment of any one of the above embodiments of the styrenic polymer, wherein the end group has structure 2), this end group has the following more specific structure 2b), wherein $L_3$ is C-1 to C-19 alkylene, and ∿∿ represent the direct valence bond attaching, the end group 2b), to the end of the polymer chain of the styrenic polymer:

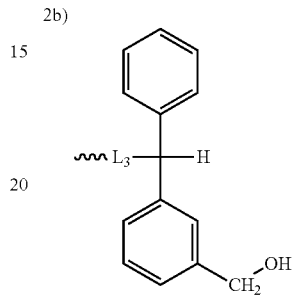

2b)

In another embodiment of any one of the above embodiments of the styrenic polymer, wherein the end group has structure 2b), $L_3$ is a C-1 to C-5 alkylene moiety.

In another embodiment of any one of the above embodiments of the styrenic polymer, wherein the end group has structure 2b), $L_3$ is a C-1 to C-2 alkylene moiety.

In another embodiment of any one of the above embodiments of the styrenic polymer, wherein the end group has structure 2b), $L_3$ is a C-1 alkylene moiety.

In another embodiment of any one of the above embodiments of the styrenic polymer, wherein the end group has structure 1), 1a), 1b), 1c) 2), 2a) 2b), the styrenic polymer has a polydispersity from 1 to about 1.1. In other aspect of this embodiment the polymer has a polydispersity from 1 to about 1.09, from 1 and about 1.08, from 1 to about 1.07, from 1 and about 1.06, from 1 to about 1.05, from 1 to about 1.04, from 1 to about 1.03, from 1 to about 1.02, or from 1 to about 1.01.

In another embodiment of any one of the above embodiments of the styrenic polymer, wherein the end group has structure 1), 1a), 1b), 1c) 2), 2a) 2b), the styrenic polymer has a Mw from about 1000 g/mol to about 50000 g/mol. In other embodiments of this aspect of the invention the styrenic polymer may have an Mw from about 1000 g/mole to about 40000 g/mol, about 1000 to about 30000, about 1000 to about 20000, about 1000 to about 10000, about 1000 to about 9000, about 1000 to about 8000, about 1000 to about 7000, about 1000 to about 6000, about 2000 to about 6000, about 3000 to about 6000, about 4000 to about 6000, about 5000 to about 6000, about 5100 to about 5500 or about 5100 to about 5400.

In another embodiment of this invention, the styrenic polymer has polydispersity from 1 to about 1.3, and has a structure 3);

3)

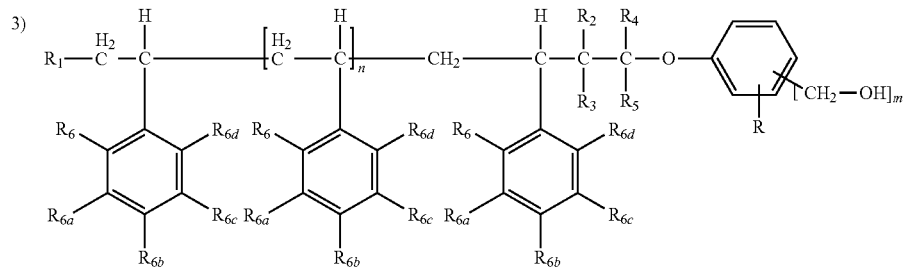

wherein $R_1$ is a C-1 to C-20 alkyl, $R_2$, $R_3$, $R_4$ and $R_5$ are independently selected from hydrogen or a C-1 to C-20 alkyl moiety, $R_6$, $R_{6a}$, $R_{6b}$, $R_{6c}$ and $R_{6d}$ are independently selected from the group consisting of hydrogen, a C-1 to C-20 alkyl, a C-1 to C-20 alkyloxy, a C-1 to C-10 fluoroalkyl, a C-1 to C-10 fluoroalkyloxy, a trialkylsilyl group, a (trialkylsilyl)alkylene group, and a (trialkylsilyl)alkyleneoxy group, R is selected from the group consisting of hydrogen, a halide, a C-1 to C-20 alkyl moiety, and a C-1 to C-20 alkyloxy moiety, n is the number of repeat unit in a polymer chain, and is a non-zero positive integer, and m is 1 to 3.

In another embodiment of any one of the above embodiments wherein the styrenic polymer has structure 3, m is 1.

In another embodiment of any one of the above embodiments wherein the styrenic polymer has structure 3, m is 2.

In another embodiment of any one of the above embodiments wherein the styrenic polymer has structure 3, m is 3.

In another embodiment of any one of the above embodiments wherein the styrenic polymer has structure 3, $R_2$, $R_3$, $R_4$ and $R_5$ are all hydrogen.

In another embodiment of any one of the above embodiments wherein the styrenic polymer has structure 3, $R_6$, $R_{6a}$, $R_{6b}$, $R_{6c}$ and $R_{6d}$ are all hydrogen.

In another embodiment of any one of the above embodiments wherein the styrenic polymer has structure 3, the styrenic polymer has the more specific structure 3a), wherein the styrenic polymer has polydispersity from 1 to about 1.3, 3a)

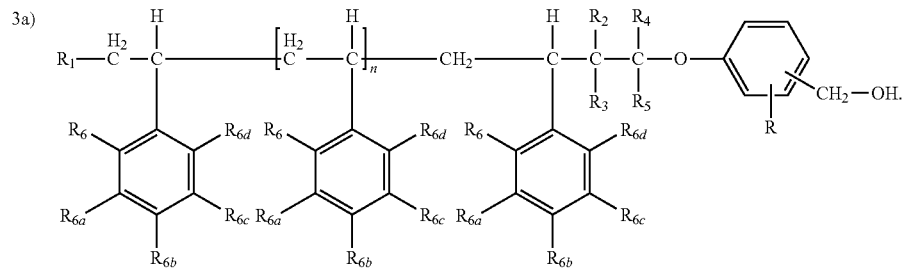

In another embodiment of any one of the above embodiments wherein the styrenic polymer has structure 3a), $R_2$, $R_3$, $R_4$ and $R_5$ are all hydrogen.

In another embodiment of any one of the above embodiments wherein the styrenic polymer has structure 3a), $R_6$, $R_{6a}$, $R_{6b}$, $R_{6c}$ and $R_{6d}$ are all hydrogen.

In another embodiment of any one of the above embodiments wherein the styrenic polymer has structure 3a), the styrenic polymer has the more specific structure 3b).

3b)

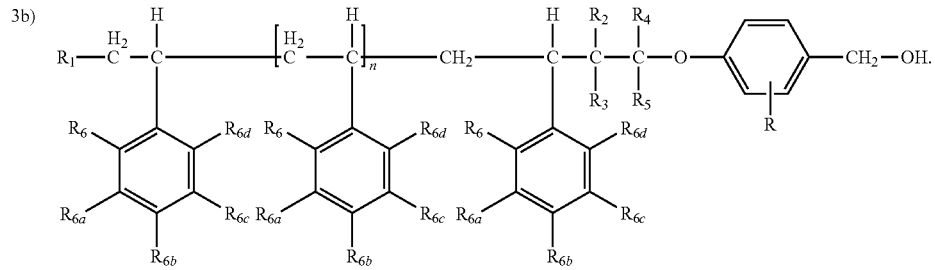

In another embodiment of any one of the above embodiments wherein the styrenic polymer has structure 3b), $R_2$, $R_3$, $R_4$ and $R_5$ are all hydrogen.

In another embodiment of any one of the above embodiments wherein the styrenic polymer has structure 3b), $R_6$, $R_{6a}$, $R_{6b}$, $R_{6c}$ and $R_{6d}$ are all hydrogen.

In another embodiment of any one of the above embodiments wherein the styrenic polymer has structure 3b), $R_1$ is a C-1 to C-6 alkyl, $R_2$, $R_3$, $R_4$ and $R_5$ are independently selected from the group consisting of hydrogen and a C-1 to C-4 alkyl moiety, $R_6$, $R_{6a}$, $R_{6b}$, $R_{6c}$ and $R_{6d}$ are independently selected from the group consisting of hydrogen, and a C-1 to C-4 alkyl, and R is hydrogen.

In another embodiment of any one of the above embodiments wherein the styrenic polymer has structure 3a) or 3b), $R_1$ is a C-1 to C-6 alkyl, $R_2$, and $R_3$, are hydrogen and $R_4$ and $R_5$ are independently selected from the group consisting of hydrogen and a C-1 to C-4 alkyl moiety, $R_6$, $R_{6a}$, $R_{6b}$, $R_{6c}$ and $R_{6d}$ are independently selected from the group consisting of hydrogen, and a C-1 to C-4 alkyl and R is hydrogen.

In another embodiment of any one of the above embodiments wherein the styrenic polymer has structure 3) 3a) or 3b), the styrenic polymer is one wherein, $R_2$ is hydrogen.

In another embodiment of any one of the above embodiments wherein the styrenic polymer has structure 3) 3a) or 3b), the styrenic polymer is one wherein, $R_2$ is C-1 to C-4 alkyl moiety.

In another embodiment of any one of the above embodiments wherein the styrenic polymer has structure 3) 3a) or 3b), 3) 3a) or 3b), $R_3$ is hydrogen.

In another embodiment of any one of the above embodiments wherein the styrenic polymer has structure 3) 3a) or 3b), $R_3$ is C-1 to C-4 alkyl moiety.

In another embodiment of any one of the embodiment wherein the styrenic polymer has structure 3) 3a) or 3b), $R_4$ is hydrogen.

In another embodiment of any one of the above embodiments wherein the styrenic polymer has structure 3) 3a) or 3b), $R_4$ is C-1 to C-4 alkyl moiety.

In another embodiment of any one of the above embodiments wherein the styrenic polymer has structure 3) 3a) or 3b), $R_5$ is hydrogen.

In another embodiment of any one of the above embodiments wherein the styrenic polymer has structure 3) 3a) or 3b), $R_5$ is C-1 to C-4 alkyl moiety.

In another embodiment of any one of the above embodiments wherein the styrenic polymer has structure 3) 3a) or 3b), $R_6$, $R_{6a}$, $R_{6b}$, $R_{6c}$ and $R_{6d}$ are hydrogen.

In another embodiment of any one of the above embodiments wherein the styrenic polymer has structure 3) 3a) or 3b), $R_1$ is a C-1 to C-6 alkyl, $R_2$, $R_3$, $R_4$ and $R_5$ are hydrogen, $R_6$, $R_{6a}$, $R_{6b}$, $R_{6c}$ and $R_{6d}$ are independently selected from the group consisting of hydrogen, and a C-1 to C-4 alkyl, and R is hydrogen.

In another embodiment of any one of the above embodiments wherein the styrenic polymer has structure 3) 3a) or 3b), $R_1$ is a C-1 to C-6 alkyl, $R_2$, $R_3$, $R_4$ and $R_5$ are hydrogen, $R_6$, $R_{6a}$, $R_{6b}$, $R_{6c}$ and $R_{6d}$ are hydrogen and R is hydrogen.

In another embodiment of any one of the above embodiments wherein the styrenic polymer has structure 3) 3a) or 3b), the styrenic polymer is one where R is a halide, this halide may be selected from the group consisting of F, Cl, Br or I. In another aspect of this embodiment the halide is F, in another the halide is Cl, in another the halide is Br in yet another the halide is I.

In another embodiment of any one of the above embodiments wherein the styrenic polymer has structure 3) 3a) or 3b), the the styrenic polymer is one wherein, where R is an alkyl moiety, R is a C-1 to C-20 alkyl moiety. In other aspect of this embodiment, R is a C-1 to C-15 alkyl moiety, R is a C-1 to C-10 alkyl moiety, R is a C-1 to C-5 alkyl moiety, R is a C-1 to C-4 alkyl moiety, R is a C-1 to C-3 alkyl moiety, R is a C-1 to C-2 alkyl moiety or R is a C-1 alkyl moiety.

In another embodiment of any one of the above embodiments wherein the styrenic polymer has structure 3) 3a) or 3b, R is an alkyloxy moiety, R is a C-1 to C-20 alkyloxy moiety. In other aspect of this embodiment, R is a C-1 to C-15 alkyloxy moiety, R is a C-1 to C-10 alkyloxy moiety, R is a C-1 to C-5 alkyloxy moiety, R is a C-1 to C-4 alkyloxy moiety, R is a C-1 to C-3 alkyloxy moiety, R is a C-1 to C-2 alkyloxy moiety or R is a C-1 alkyloxy moiety.

In another embodiment of this invention, the styrenic polymer has polydispersity from 1 to about 1.3 and has a structure 4), wherein $R_1$ is a C-1 to C-20 alkyl, $R'_2$, $R'_3$, are independently selected from hydrogen or a C-1 to C-20 alkyl moiety, $R_6$, $R_{6a}$, $R_{6b}$, $R_{6c}$ and $R_{6d}$ are independently selected from the group consisting of hydrogen, a C-1 to C-20 alkyl, a C-1 to C-20 alkyloxy, a C-1 to C-10 fluoroalkyl, a C-1 to C-10 fluoroalkyloxy, a trialkylsilyl group, a (trialkylsilyl)alkylene group, and a (trialkylsilyl)alkyleneoxy group, R' is selected from the group consisting of hydrogen, a halide, a C-1 to C-20 alkyl moiety, and a C-1 to C-20 alkyloxy moiety, n is the number of repeat unit in a polymer chain, and is a non-zero positive integer, and m' is an integer from 1 to 3.

4)

In another embodiment of any one of the above embodiments, wherein the styrenic polymer has structure 4), $R'_2$ and $R'_3$ are independently selected from a C-1 to C-10 alkylene moiety.

In another embodiment of the styrenic polymer having structure 4), is one wherein m' is 1 or 2.

In another embodiment of any one of the above embodiments, wherein the styrenic polymer has structure 4), is one wherein R' and R" are hydrogen.

In another embodiment of any one of the above embodiments, wherein the styrenic polymer has structure 4), is one wherein $R_6$, $R_{6a}$, $R_{6b}$, $R_{6c}$ and $R_{6d}$ are independently selected from the group consisting of hydrogen.

In another embodiment of any one of the above embodiments, wherein the styrenic polymer has structure 4), it has the more specific structure 4a) wherein $R_1$ is a C-1 to C-20 alkyl, $R'_2$, $R'_3$, are independently selected from hydrogen or a C-1 to C-20 alkyl moiety, $R_6$, $R_{6a}$, $R_{6b}$, $R_{6c}$ and $R_{6d}$ are independently selected from the group consisting of hydrogen, a C-1 to C-20 alkyl, a C-1 to C-20 alkyloxy, a C-1 to C-10 fluoroalkyl, a C-1 to C-10 fluoroalkyloxy, a trialkylsilyl group, a (trialkylsilyl)alkylene group, and a (trialkylsilyl)alkyleneoxy group, R' is selected from the group consisting of hydrogen, a halide, a C-1 to C-20 alkyl moiety, and a C-1 to C-20 alkyloxy moiety, n is the number of repeat unit in a polymer chain, and is a non-zero positive integer.

4a)

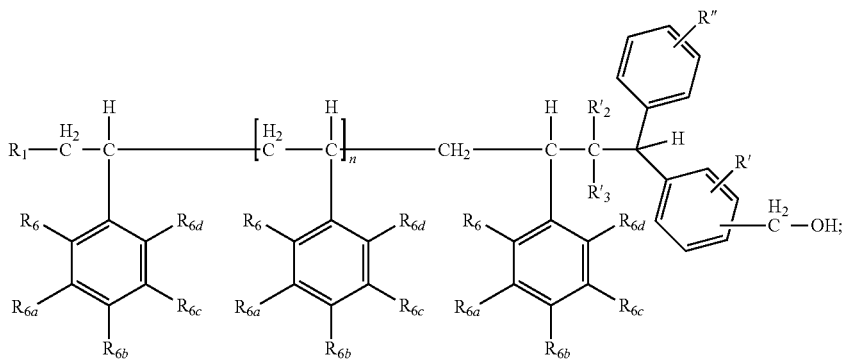

In another embodiment of any one of the above embodiments, wherein the styrenic polymer has structure 4a), $R'_2$ and $R'_3$ are independently selected from a C-1 to C-10 alkylene moiety.

In another embodiment of the styrenic polymer having structure 4a), is one wherein R' and R" are hydrogen.

In another embodiment of any one of the above embodiments, wherein the styrenic polymer has structure 4a), $R_6$, $R_{6a}$, $R_{6b}$, $R_{6c}$ and $R_{6d}$ are independently selected from the group consisting of hydrogen.

In another embodiment of any one of the above embodiments wherein the styrenic polymer has structure 4) or 4a), the styrenic polymer has the more specific structure 4b)

has a structure 4b), wherein $R_1$ is a C-1 to C-20 alkyl, $R'_2$, $R'_3$, are independently selected from hydrogen or a C-1 to C-20 alkyl moiety, $R_6$, $R_{6a}$, $R_{6b}$, $R_{6c}$ and $R_{6d}$ are independently selected from the group consisting of hydrogen, a C-1 to C-20 alkyl, a C-1 to C-20 alkyloxy, a C-1 to C-10 fluoroalkyl, a C-1 to C-10 fluoroalkyloxy, a trialkylsilyl group, a (trialkylsilyl)alkylene group, and a (trialkylsilyl)alkyleneoxy group, R' is selected from the group consisting of hydrogen, a halide, a C-1 to C-20 alkyl moiety, and a C-1 to C-20 alkyloxy moiety, n is the number of repeat unit in a polymer chain, and is a non-zero positive integer.

4b)

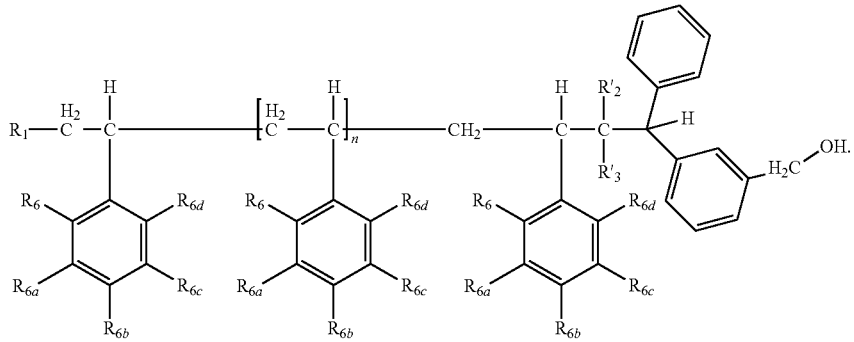

In another embodiment of any one of the above embodiments, wherein the styrenic polymer has structure 4), 4a) or 4b), R'$_2$ and R'$_3$ are independently selected from a C-1 to C-10 alkylene moiety.

In another embodiment of any one of the above embodiments, wherein the styrenic polymer has structure 4), 4a) or 4b), R' and R" are hydrogen.

In another embodiment of any one of the above embodiments, wherein the styrenic polymer has structure 4), 4a) or 4b), R' and R" are hydrogen.

In another embodiment of any one of the above embodiments, wherein the styrenic polymer has structure 4), 4a) or 4b), R$_6$, R$_{6a}$, R$_{6b}$, R$_{6c}$ and R$_{6d}$ are hydrogen.

In another embodiment of any one of the above embodiments, wherein the styrenic polymer has structure 4), 4a) or 4b), R$_1$ is a C-1 to C-6 alkyl, R'$_2$, R'$_3$, are independently selected from the group consisting of hydrogen and a C-1 to C-4 alkyl moiety, R$_6$, R$_{6a}$, R$_{6b}$, R$_{6c}$ and R$_{6d}$ are independently selected from the group consisting of hydrogen, and a C-1 to C-4 alkyl, and R' and R" are hydrogen.

In another embodiment of any one of the above embodiments, wherein the styrenic polymer has structure 4), 4a) or 4b), R$_1$ is a C-1 to C-6 alkyl, R'$_2$, and R'$_3$, are hydrogen, R$_6$, R$_{6a}$, R$_{6b}$, R$_{6c}$ and R$_{6d}$ are independently selected from the group consisting of hydrogen, and a C-1 to C-4 alkyl and R' and R" are hydrogen.

In another embodiment of any one of the above embodiments, wherein the styrenic polymer has structure 4), 4a) or 4b), R$_1$ is a C-1 to C-6 alkyl, R'$_2$, R'$_3$ are hydrogen, R$_6$, R$_{6a}$, R$_{6b}$, R$_{6c}$ and R$_{6d}$ are hydrogen and R' and R" are hydrogen.

In another embodiment of any one of the above embodiments, wherein the styrenic polymer has structure 4), 4a) or 4b), R' and R" are hydrogen.

In another embodiment of any one of the above embodiments, wherein the styrenic polymer has structure 4), 4a) or 4b), R' and R" are a halide.

In another embodiment of any one of the above embodiments, wherein the styrenic polymer has structure 4), 4a) or 4b), R' and R" are a C-1 to C-20 alkyl moiety.

In another embodiment of any one of the above embodiments, wherein the styrenic polymer has structure 4), 4a) or 4b), R' and R" are a C-1 to C-20 alkyloxy moiety.

In another embodiment of any one of the above embodiments, wherein the styrenic polymer has structure 4), 4a) or 4b), R$_6$, R$_{6a}$, R$_{6b}$, R$_{6c}$ and R$_{6d}$ are hydrogen.

In another embodiment of any one of the above embodiments, wherein the styrenic polymer has structure 4), 4a) or 4b), R'$_2$, is hydrogen.

In another embodiment of any one of the above embodiments, wherein the styrenic polymer has structure 4), 4a) or 4b), R'$_2$, is a C-1 to C-20 alkyl moiety.

In another embodiment of any one of the above embodiments, wherein the styrenic polymer has structure 4), 4a) or 4b), R'$_3$, is hydrogen.

In another embodiment of any one of the above embodiments, wherein the styrenic polymer has structure 4), 4a) or 4b), R'$_3$, is a C-1 to C-20 alkyl moiety.

In another embodiment of any one of the above embodiments, wherein the polymer has structure 3), 3a), 3b), 4), 4a), or 4b), this polystyrene has a polydispersity from 1 to about 1.1. In other aspect of this embodiment the polymer has a polydispersity from 1 to about 1.09, from 1 to about 1.08, from 1 to about 1.07, from 1 to about 1.06, from 1 to about 1.05, from 1 to about 1.04, from 1 to about 1.03, from 1 to about 1.02, or from 1 to about 1.01.

In another embodiment of any one of the above embodiments, wherein the polymer has structure 3), 3a), 3b), 4), 4a), or 4b), the styrenic polymer has a Mw from about 1000 g/mol to about 50000 g/mol. In other embodiments of this aspect of the invention the styrenic polymer may have an Mw from about 1000 g/mole to about 40000 g/mol, about 1000 to about 30000, about 1000 to about 20000, about 1000 to about 10000, about 1000 to about 9000, about 1000 to about 8000, about 1000 to about 7000, about 1000 to about 6000, about 2000 to about 6000, about 3000 to about 6000, about 4000 to about 6000, about 5000 to about 6000, about 5100 to about 5500 or about 5100 to about 5400.

Another aspect of this invention is a composition which is comprised of a styrenic polymer and a solvent, where the styrenic polymer is selected from any one of the above described embodiments of the styrenic polymer.

In another embodiment of this invention the styrenic polymer may be a mixture of two or more different styrenic polymer selected from any of the above described embodiment of the styrenic polymer.

In another aspect of this novel composition, it may comprise further additives as components such surfactants, levelling agents, stabilizers, thermal acid generators, photoacid generators and the like.

In the above embodiments of the novel composition, the solvent is one which dissolves the novel styrenic polymer and any other additional component. This solvent may be a single solvent or a mixture of solvents. Suitable solvents are organic solvent which may include, for example, a glycol ether derivative such as ethyl cellosolve, methyl cellosolve, propylene glycol monomethyl ether (PGME), diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate (PGMEA); carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate (EL), ethyl glycolate, and ethyl-3-hydroxy propionate; a ketone ester such as methyl pyruvate or ethyl pyruvate; an alkyloxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; a ketal or acetal like 1,3 dioxalane and diethoxypropane; lactones such as butyrolactone; an amide derivative such as dimethylacetamide or dimethylformamide, anisole, and mixtures thereof.

The novel composition, in addition to the solvent, may contain surfactants as additives to facilitate coating.

Also, the novel composition may optionally comprise an acid generator such as a thermal acid generator and/or a photoacid generator. Although such additives are not required for assisting these additives by releasing acid may assist in the grafting reaction of the benzyl alcohol end group moiety of the novel styrenic polymer on a substrate to form a pinning layer. This may both assist in accessing a higher level of grafting reaction at the substrate surface and may also allow the bake temperature needed to affect grafting after coating to be lowered.

Suitable thermal acid generators include the onium salts, halogen containing compounds, perfluorobenzene sulfonate esters, perfluoroalkane sulfonate esters. Without limitation, exemplary thermal acid generators for the above formulationinclude tri-C-1 to C-8-alkylammonium p-toluenesulfonate, C-1 to C-8-alkylammonium dedecylbenzenesulfonate, tri-C-1 to C-8-alkylammonium perfluorobutane-1-sulfonate, tri-C-1 to C-8-alkylammonium trifluoromethane-sulfonate, N-hydroxyphthalimide trifluoromethane sulfonate, bis(4-t-butyl phenyl)iodonium trifluoromethane sulfonate, bis(4-t-butyl phenyl)iodonium perfluoro-1-butanesulfonate, bis(4-t-butyl phenyl)iodonium perfluoro-I-octanesulfonate, bis(phenyl)iodonium hexafluoroantimonate, N-hydroxy-5-norbornene-2,3-dicarboximide perfluoro1-butanesulfonate, 2-nitrobenzyl trifluoromethanesulfonate, 4-nitrobenzyl trifluoromethanesulfonate, 2-nitrobenzyl perfluorobutane sulfonate, 4-nitrobenzyl perfluorobutanesulfonate or a combination comprising at least one of the foregoing. Suitable photoacid generators include, for example, aromatic and aliphatic sulfonium salts and iodonium salts.

Another aspect of this invention is a novel process of grafting a pinning layer on a substrate comprised of steps:
a) coating the substrate any the above described compositions comprised of either any the novel styrenic polymer of embodiments 1 or 2 a coated layer;
b) heating the coated layer of polymer at a temperature from about 120° C. to about 190° C. to remove solvent and affect grafting;
c) treating the heated coated layer with an organic solvent to remove ungrafted polymer, leaving an insoluble grafted pinning layer on the substrate.

In another aspect of novel process grafting a pinning layer on a substrate the novel composition step b) to remove solvent and graft the copolymer on the substrate, this step may be done at temperatures ranging from about 140° C. to about 170° C., or 150° C. to about 170° C. The time for removing solvent and graft the novel styrenic polymer on the substrate is about 1-10 minutes or about 1-5 minutes.

In another aspect of novel process grafting a pinning layer the typical initial film thickness prior to removal of ungrafted material in step c) range from about 10 nm to about 200 nm after heating, or about 20 nm to about 100 nm, or about 20 nm to about 80 nm, or about 30 nm to about 60 nm, or about 40 nm to about 60 nm.

If a thermal acid generator is present as an additive the temperature needed to affect solvent removal and grafting in b) may be from about 90° C. to about 170° C., or about 100° C. to about 170° C. Here also, the time for removing solvent and graft the novel styrenic polymer on the substrate may be about 1-10 minutes or in another embodiment about 2-5 minutes.

If a photoacid generator is present, the acid is released during an optional blanket irradiation step with UV, deep UV or VUV radiation after a bake to remove solvent only in the range of about 90 to about 150° C. Subsequent to the irradiation step for photoacid generators releasing a high acidity photoacid (i.e. $pK_a < -2$) it may be possible to affect grafting without a subsequent grafting bake step or to proceed with a moderate grafting bake step from about 90 to about 150° C. Otherwise, for photoacid generators releasing a lower acidity photoacid (i.e. $pK_a \geq -2$) a baking temperature in the range of about 90 to about 200° C. may be employed. Generally, the heating time to remove solvent and graft the copolymer to the substrate is 1-10 minutes, or another embodiment 1-5 minutes.

Another aspect of this invention is a novel first of process of chemoepitaxy, directed self-assembly of a block copolymer layer used to form an image which is comprised of the steps:
a1) coating the substrate with a graftable neutral layer polymer precursor to form a coated layer 1;
b1) heating coated layer 1 at a temperature from 90° C. to 180° C. to remove solvent;
c1) heating the coating after step b1) at a temperature from 200° C. to 300° C. to affect grafting;
d1) treating the coating after step c1) with an organic solvent to remove ungrafted neutral layer polymer, leaving an insoluble grafted neutral layer on the substrate;
e1) coating a photoresist layer over the grafted neutral layer;
f1) forming a negative tone pattern in the photoresist layer, thereby forming regions in which the grafted neutral layer is covered or uncovered by the resist, where the pattern in the resist is comprised of both small nanometer sized repeating patterns and also large areas of resist removed during the imaging process containing no repeating nanometer sized patterns;
g1) etching to remove the neutral layer regions uncovered in step f1) leaving bare substrate in these regions;
h1) stripping the resist away from the substrate after step g1), leaving a patterned substrate in which regions of substrate left uncovered by resist in step f1) are free of a grafted neutral layer and the regions covered by resist in step f1) retain the grafted neutral layer;
i1) coating the patterned substrate with the composition of claim 26 or 27 to form a coated layer 2;

j1) heating the coated layer 2 a temperature from 120° C. to 190° C.;

k1) treating the coated layer 2 after heating step j1) with an organic solvent to remove ungrafted polymer, leaving an insoluble grafted pinning layer material on the substrate in the regions free of grafted neutral layer creating a substrate with both pinning layer areas and neutral layer areas;

l1) applying a coating of a block copolymer comprising an etch resistant styrenic block and a highly etchable aliphatic block over the substrate containing a patterned neutral layer and pinning layer, creating a substrate containing both a patterned neutral layer and a patterned pinning layer;

m1) annealing the block copolymer layer until directed self-assembly occurs in the small nanometer sized repeating patterns of the substrate, but where no perpendicular orientation of block polymer domains occurs in the large areas containing grafted pinning layer.

In another aspect of the above novel first of process of chemoepitaxy in step j1) the temperature for affecting grafting may be varied, as previously described for the process of forming a grafted cross-linked coating of the novel copolymer of this invention. Also, the baking time this step may be varied as previously described. In another embodiment of this aspect of the invention is to form an image into the substrate by having a step n1) following step m1) in which the self-assembled bock copolymer domains are used to provide a selective barrier against etching into the substrate. This selectivity etching may either be imparted by a differing reactivity of the assembled block domains towards a chemical etchant, or by a differing reactivity towards a plasma etching step, used to etch the substrate. One example is when one block is plasma etch resistant block and the other is highly etchable by the plasma. Selective etching into the substrate by the self-assembled block copolymer may be used to provide an image into the substrate. In turn this image may be used to in the manufacture of microelectronic devices by defining structures in specific layers employed in a process to make a memory or logic device. Negative or positive resists may be employed in steps e1) and f1). Although for positive resist their tone is reversed to obtain a negative image instead of positive by using an organic solvent to develop instead of a TMAH based developer. Also, the radiation used to form the photoresist pattern formed in step f1) may be selected from e-beam, broadband UV, 193 nm immersion lithography, 13.5 nm, 193 nm, 248 nm, 365 nm and 436 nm radiation.

Another aspect of this invention is a second novel process of chemoepitaxy, directed self-assembly of a block copolymer layer used to form an image comprised of the steps:

a2) forming a coating of a neutral layer polymer precursor which is crosslinkable or which is both crosslinkable and graftable on a substrate;

b2) heating the neutral polymer layer precursor coating which is crosslinkable or the precursor coating which is both crosslinkable and graftable at a temperature from about 90° C. to about 180° C. to remove solvent;

c2) heating the neutral layer polymer precursor coating which is crosslinkable or the coating precursor coating which is both crosslinkable and graftable at a temperature from about 200° C. to about 300° C. to form a crosslinked neutral layer or a crosslinked and grafted neutral layer;

d2) providing a coating of a photoresist layer over the crosslinked neutral layer or over the crosslinked and grafted neutral layer;

e2) forming a negative tone pattern in the photoresist layer, thereby forming regions in which the crosslinked or the crosslinked and grafted neutral layer is covered or uncovered by the resist, where the pattern in the resist is comprised of both small nanometer repeating patterns and also large areas of resist removed during the imaging process containing no repeating nanometer sized patterns;

f2) etching with a plasma to remove in the neutral layer regions uncovered in step e2) removing crosslinked or crosslinked and grafted neutral layer leaving bare substrate in the regions uncovered in step e2);

g2) stripping the resist away from the substrate after step f2), leaving a patterned substrate in which regions of substrate left uncovered by resist in step e2) are free of a crosslinked or crosslinked and grafted neutral layer and the regions covered by resist in step f2) retain the crosslinked or crosslinked and grafted neutral layer;

h2) coating the patterned substrate with the composition of claim 26 or 27 to form a coated layer;

i2) heating the coated layer at a temperature from 120° C. to 190° C.;

j2) treating the coated layer after heating step i2) with an organic solvent to remove ungrafted polymer, leaving an insoluble crosslinked or crosslinked and grafted pinning layer material on the substrate in the regions free of crosslinked neutral layer or free of crosslinked and grafted neutral layer, creating a substrate containing both a patterned neutral layer and a patterned pinning layer;

k2) applying a coating of a block copolymer comprising an etch resistant styrenic block and a highly etchable aliphatic block over the substrate containing a patterned neutral layer and pinning layer;

l2) annealing the block copolymer layer until directed self-assembly occurs in the small nanometer sized repeating patterns of the substrate, but where no perpendicular orientation of block polymer domains occurs in the large areas containing grafted pinning layer;

In another aspect of the above novel second of process of chemoepitaxy in step j2) the temperature for affecting grafting may be varied, as previously described for the process of forming a grafted cross-linked coating of the novel copolymer of this invention. Also, the baking time this step may be varied as previously described. In another embodiment of this aspect of the invention is to form an image into the substrate by having a step m2) following step l2) in which the self-assembled bock copolymer domains are used to provide a selective barrier against etching into the substrate. This selectivity etching may either be imparted by a differing reactivity of the assembled block domains towards a chemical etchant, or by a differing reactivity towards a plasma etching step, used to etch the substrate. One example is when one block is plasma etch resistant block and the other is highly etchable by the plasma. Selective etching into the substrate by the self-assembled block copolymer may be used to provide an image into the substrate. In turn this image may be used to in the manufacture of microelectronic devices by defining structures in specific layers employed in a process to make a memory or logic device. Negative or positive resists may be employed in steps d2) and e2). Although for positive resist their tone is reversed to obtain a negative image instead of positive by using an organic solvent to develop instead of a TMAH based developer. Also, the radiation used to form the photoresist pattern formed in step f2) may be selected from e-beam, broadband, 193 nm immersion lithography, 13.5 nm, 193 nm, 248 nm, 365 nm and 436 nm radiation.

In general, but not bound by theory, when the substrate has a favorable interfacial energy with one domain than the other of a lamellar forming di-block copolymer, the interaction between the substrate and favorable domain causes the lamellar to be oriented parallel to the substrate in the thin film instead of perpendicular orientation. This parallel morphology of thin film has three typical structures such as asymmetric, symmetric and, hole and island structure depending on the BCP film thickness and the interfacial energy between the BCP domains and ambient environment (e.g. air or $N_2$). On a substrate grafted with polystyrene (PS) and coated with the BCP and annealed, in an $N_2$ atmosphere, both the PS domain and PMMA domain have the same interfacial energy. Consequently, both PS and PMMA domains can be located in an orientation parallel to the substrate surface.

Specifically, in the large areas stripped of neutral layer in the above described processes, on which a layer of the novel polystyrenic polymer can grafted on the bare substrate, this grafted layer produces a unexpectedly strong, dense and uniform pinning layers which may be used to avoid defect formation in these large areas which would occur for a diblock lamellar forming block copolymer of a styrenic (or other etch resistant polymer block of similar polarity to the novel grafted polystyrenic layer formed from the novel polymer) and aliphatic block (or other etchable polymer block of different polarity than the styrenic block). The formation of such an unexpectedly strong pinning layer produce a surface which is very favorable to a consistent parallel lamellar orientation of the block copolymer consistently over the entire large area with the grafted pinning layer. These parallel lamellar orientations give rise to a block copolymer coating which concomitant with its uniformity of orientation, during pattern etching, gives a consistent etching rate over the entire area. This uniformity of etching over large areas the block copolymer coating, prevents formation of defect areas of inconsistent etch rate. This would occur if the block copolymer coating, during self-assembly, formed self-assembled island or hole structures morphologies, which would otherwise occur at a substrate for a given coating of a lamellar forming di block copolymer, having a given Lo which would on a good pinning area form either asymmetric or symmetric structures having parallel lamellar orientations of the block copolymer domains. Thus, in summary, for the grafted pinning layer formed from the novel styrenic polymers there is formation of an unexpectedly strong and uniform pinning layer which leads in turn to a consistent formation of parallel lamellar formation over the entire large area which do not contain nanometer sized repeating patterns such as lines and spaces or trenches.

In the above described grafting process and in chemoepitaxy processes 1 or 2, the solvent needed to remove the ungrafted novel styrenic polymer may be such solvents as previously described as suitable to dissolve these materials to form the novel compositions described herein.

Similarly in the above described chemoepitaxy processes 1 or 2 the solvent suitable for removing ungrafted, uncrosslinked, or ungrafted and uncrosslinked neutral layer precursor are ones as described suitable in the references previously incorporated by reference used to describe suitable neutral layer materials.

In the above described chemoepitaxy process 1 or 2, the block copolymer for use in conjunction with the novel styrenic composition capable of forming a pinning layer can be any block copolymers which can form domains through self-assembly. The microdomains are formed by blocks of the same type which tend to self-associate. Typically, block copolymer employed for this purpose are polymers in which the repeat units derived from monomers are arranged in blocks which are different compositionally, structurally or both and are capable of phase separating and forming domains. The blocks have differing properties which can be used to remove one block while keeping the other block intact on the surface, thus providing a pattern on the surface. Thus, the block may be selectively removed by plasma etching, solvent etching, developer etching using aqueous alkaline solution, etc. In block copolymers based on organic monomers, one block can be made from polyolefinic monomers including polydienes, polyethers including poly(alkylene oxides) such as poly(ethylene oxide), poly(propylene oxide), poly(butylene oxide) or mixtures thereof; and, the other block can be made from different monomers including poly((meth)acrylates), polystyrenes, polyesters, polyorganosiloxanes, polyorganogermanes, and or mixtures thereof. These blocks in a polymer chain can each comprise one or more repeat units derived from monomers. Depending on the type of pattern needed and methods used different types of block copolymers may be used. For instance, these may consist of diblock copolymers, triblock copolymers, terpolymers, or multiblock copolymers. The blocks of these block copolymers may themselves consist of homopolymers or copolymers. Block copolymers of different types may also be employed for self-assembly, such as dendritic block copolymers, hyperbranched block copolymers, graft block copolymers, organic diblock copolymers, organic multiblock copolymers, linear block copolymers, star block copolymers amphiphilic inorganic block copolymers, amphiphilic organic block copolymers or a mixture consisting of at least block copolymers of different types.

The blocks of organic block copolymer may comprise repeat units derived from monomers such as C-2 to C-30 olefins, (meth)acrylate monomers derived from C-1 to C-30 alcohols, inorganic-containing monomers including those based on Si, Ge, Ti, Fe, Al. Monomers based on C-2 to C-30 olefins can make up a block of high etch resistance alone or do so in combination with one other olefinic monomer. Specific example of olefinic monomers of this type are ethylene, propylene, 1-butene, 1,3-butadiene, isoprene, dihydropyran, norbornene, maleic anhydride, styrene, 4-hydroxy styrene, 4-acetoxy styrene, 4-methylstyrene, alpha-methylstyrene or mixtures thereof. Examples of highly etchable units can be derived from (meth)acrylate monomers such as (meth)acrylate, methyl (meth)acrylate, ethyl (meth) acrylate, n-propyl (meth)acrylate, isopropyl (meth)acrylate, n-butyl (meth)acrylate, isobutyl (meth)acrylate, n-pentyl (meth)acrylate, isopentyl (meth)acrylate, neopentyl (meth) acrylate, n-hexyl (meth)acrylate, cyclohexyl (meth)acrylate, isobornyl (meth)acrylate, hydroxyethyl (meth)acrylate or mixtures thereof.

An illustrative example of a block copolymer containing one type of high etch resistant repeat unit would be a polystyrene block containing only repeat units derived from styrene and another type of highly etchable polymethylmethacrylate block containing only repeat units derived from methylmethacrylate. These together would form the block copolymer poly(styrene-b-methylmethacrylate), where b refers to block.

Specific non-limiting examples of block copolymers that are useful for graphoepitaxy, chemoepitaxy or pinned chemoepitaxy as used for directed self-assembly on a patterned substrate containing areas of patterned neutral layer, and areas of the patterned novel polystyrenic pinning layer are poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), or a combination comprising at least one of the above described block copolymers. All these polymeric materials share in common the presence of at least one block which is rich in repeat units resistant to etching techniques typically employed in manufacturing IC devices and at least one block which etches rapidly under these same conditions. This allows for the directed self-assembled polymer to pattern transfer onto the substrate to affect either pattern rectification or pattern multiplication.

Typically, the block copolymers employed for the directed self-assembly such as in graphoepitaxy, chemoepitaxy or pinned chemoepitaxy have a weight-averaged molecular weight ($M_w$) in the range of about 3,000 to about 500,000 g/mol and a number averaged molecular weight ($M_n$) of about 1,000 to about 60,000 and a polydispersity ($M_w/M_n$) of about 1.01 to about 6, or 1.01 to about 2 or 1.01 to about 1.5. Molecular weight, both $M_w$ and $M_n$, can be determined by, for example, gel permeation chromatography using a universal calibration method, calibrated to polystyrene standards. This ensures that the polymer blocks have enough mobility to undergo self-assembly when applied to a given surface either spontaneously, or by using a purely thermal treatment, or through a thermal process which is assisted by the absorption of solvent vapor into the polymer framework to increase flow of segments enabling self-assembly to occur.

Solvents suitable for dissolving block copolymers for forming a film can vary with the solubility requirements of the block copolymer. Examples of solvents for the block copolymer assembly include propylene glycol monomethyl ether acetate (PGMEA), ethoxyethyl propionate, anisole, ethyl lactate, 2-heptanone, cyclohexanone, amyl acetate, n-butyl acetate, n-amyl ketone (MAK), gamma-butyrolactone (GBL), toluene, and the like. In an embodiment, specifically useful casting solvents include propylene glycol monomethyl ether acetate (PGMEA), gamma-butyrolactone (GBL), or a combination of these solvents.

The block copolymer composition can comprise additional components and/or additives selected from the group consisting of: inorganic-containing polymers; additives including small molecules, inorganic-containing molecules, surfactants, photoacid generators, thermal acid generators, quenchers, hardeners, cross-linkers, chain extenders, and the like; and combinations comprising at least one of the foregoing, wherein one or more of the additional components and/or additives co-assemble with the block copolymer to form the block copolymer assembly.

The block copolymer composition is applied on a patterned substrate containing areas of patterned neutral layer, and areas of the patterned novel polystyrenic pinning layer are defined on a surface by conventional lithography as described above, where the neutral layer surface is formed by a material as previously described and the pinning layer is formed the novel styrenic polymers described herein. Upon application and solvent removal, the block copolymer then undergoes self-assembly directed by the specific pattern formed by conventional lithographic processing over the neutral layer through a patterned chemical difference of the substrate surface created by conventional lithographic process. Either pattern rectification maintaining the same resolution is achieved and/or pattern multiplication may also be achieved if multiple phase boundaries are formed between the features defined with conventional lithography, depending on the relative pitch of the pattern versus the microphase separation distance after standard IC processing to pattern transfer.

The application of the block copolymer by spinning techniques (including spin drying) can suffice to form the self-directed block copolymer assembly. Other methods of self-directed domain formation can occur during applying, baking, annealing, or during a combination of one or more of these operations. In this way, an oriented block copolymer assembly is prepared by the above method, having microphase-separated domains that comprise cylindrical microdomains oriented perpendicular to the neutral surface, or that comprise lamellar domains oriented perpendicular to the neutral surface. Generally, the microphase-separated domains are lamellar domains oriented perpendicular to the neutral surface, which provide parallel line/space patterns in the block copolymer assembly. The domains, so oriented, are desirably thermally stable under further processing conditions. Thus, after coating a layer of a block copolymer assembly including a useful diblock copolymer such as, for example, poly(styrene-b-methyl methacrylate), and optionally baking and/or annealing, the domains of the block copolymer will form on and remain perpendicular to the neutral surface, giving highly resistant and highly etchable regions on the surface of the substrate, which can be further pattern transferred in the substrate layers. The directed self-assembled block copolymer pattern is transferred into the underlying substrate using known techniques. In one example wet or plasma etching could be used with optional UV exposure. Wet etching could be with acetic acid. Standard plasma etch process, such as a plasma comprising oxygen may be used; additionally argon, carbon monoxide, carbon dioxide, $CF_4$, $CHF_3$, may be present in the plasma.

In the present invention the initial negative tone photoresist pattern used for forming the directed self-assembly pattern can be defined using either negative or positive photoresists, in negative tone development processes, and imageable using any conventional lithographic techniques, such as e-beam, ion beam, x-ray, EUV (13.5 nm), broadband, or UV (450 nm-10 nm) exposure, immersion lithography, etc. In one embodiment the present invention is particularly useful for 193 nm imagewise exposure using either dry lithography or immersion lithography. For 193 nm lithography a commercially available positive 193 nm photoresist can be employed such as the non-limiting example of AZ AX2110P (available from EMD Performance Materials Corp, Somerville, N.J.), photoresist from Shin-Etsu Chemical Corp., JSR Micro from Japan Synthetic Rubber, and other photoresists available from Fujifilm, TOK, etc. These photoresists may be developed after exposure, and post exposure baked using an aqueous alkaline developer comprising tetramethylammonium hydroxide to give a positive tone pattern or developed using an organic solvent such as n-amyl ketone (MAK), n-butyl acetate, anisole, etc. to give a negative tone pattern. Alternatively, also for 193 nm exposure, commercially available negative tone photoresists may be employed. One particular feature of the present invention is that despite the high level of crosslinking of the neutral layer, unexpectedly neutrality of the neutral layer toward the block copolymer is maintained. The high level of crosslinking is required when processing steps occur, such as overcoating with photoresist, baking the photoresist, exposing the photoresist, developing the photoresist pattern with the developers employed as described above for each type of photoresist, stripping conditions, etc.; but the novel neutral film still retains neutrality thus allowing for proper orientation of the block copolymer domains between the topographical lithographic features. The neutrality is required to control the orientation of the block copolymer during the alignment process, such that the domains of the block copolymer will form on and remain perpendicular to the neutral surface, as shown in FIGS. 1a-1c. FIGS. 1a-1c show how the block copolymer orients itself into domains perpendicular to the substrate and one of the domains is removes to give a pattern on the substrate.

The substrate usable with these inventive chemoepitaxy and grafting process any required in the manufacture of an IC device. In one example the substrate is a wafer coated with a layer of high carbon content organic layer with a coating of silicon or titanium containing ARC (high etch resistance to oxygen plasma) over it, which allows pattern transfer of the patterned block copolymer into these coatings. Suitable substrates include, without limitation, silicon, silicon substrate coated with a metal surface, copper coated silicon wafer, copper, aluminum, polymeric resins, silicon dioxide, metals, doped silicon dioxide, silicon nitride, silicon carbide, tantalum, polysilicon, ceramics, aluminum/copper mixtures, glass, coated glass; gallium arsenide and other such Group III/V compounds. These substrates may be coated with antireflective coating(s). The substrate may comprise any number of layers made from the materials described above.

For the present invention a variety of processes involving pinned chemoepitaxy may be employed to achieve a directed self-assembly of the aforementioned block copolymer using along with the novel styrenic polymer composition known neutral layers as described in U.S. Pat. Nos. 8,835,581, 9,181,449, 9,093,263, 8,691,925, US20140335324A1, US2016-0122579A1 or U.S. application Ser. No. 14/885,328, which are all incorporated herein by reference. This pattern can then be further transferred into the substrate. In this manner, a variety of high resolution features may be pattern transferred into the substrate achieving either pattern rectification, pattern multiplication or both.

In chemoepitaxy, the substrate surface provides a pinning surface feature in the novel neutral layer which has a particular chemical affinity towards a block of the block copolymer, and it is this affinity and the presence of the neutral layer which orients the alignment of the block copolymer. A neutral layer which is resistant to lithographic processes and maintain neutrality after crosslinking may be used as described above. The pinning feature in the novel chemoepitaxy processes 1 and 2 described above prepared from the composition comprised of the novel styrenic polymers described herein.

We have unexpectedly found that the novel copolymers when formulated in a composition comprised of the novel polymer and a solvent and coated on a substrate via novel process can provide and maintain a grafted layer with very good film uniformity across and also act as a pinning layer towards block copolymers during processing involving self-assembly. This has the advantage, as discussed in detail above, that it allows during self-assembly of an overlying block copolymer for a consistent formation of parallel lamellar formation over the entire large area which do not contain nanometer sized repeating patterns such as lines and spaces or trenches. This in turns avoids the random formation of perpendicular lamellar orientation polymer block domains in the block polymer film overlying this large area of the substrate not containing patterns. This random perpendicular orientation of block copolymer film overlying would result in the block copolymer film having randomly distributed areas with drastically different etch resistance which during pattern transfer into the substrate would cause defects to arise.

EXAMPLES

Reference will now be made to more specific embodiments of the present disclosure and experimental results that provide support for such embodiments. However, Applicants note that the disclosure below is for illustrative purposes only and is not intended to limit the scope of the claimed subject matter in any way.

Polymer molecular weights were determined with a Water 2695 Alliance Module gel permeation chromatograph (Waters Corporation, 34 Maple Street, Milford, Mass.), provided with one Shodex KF-801, two KF-802, one KF-804 columns and dual ultraviolet detector (Model 2487) and differential refractometry detector (Mode 2414). The solvent used was tetrahydrofuran flowing at 0.7 mL/min at 40° C. and the calibration was carried out with standard polystyrene samples.

All chemicals were obtained from Millipore Sigma, (Billerica Ma).

Lithographic Exposures were done with a Hamamatsu Photonics (250 Wood Avenue Middlesex, N.J. 08846), EX-mini. Etching Experiments were done with a Nordson March (300 Nordson Dr. M/S 47 Amherst, Ohio 44001 U.S.A.) RIE-1700. Spinning and development of films and patterns was done with a Litho Tech Japan (Litho Tech Japan Corporation 2-6-6-201 Namiki, Kawaguchi-shi, Saitama, 3320034, Japan), LARC1012 or a SOKUDO (5th Fl. K•I Shijo Building, 88 Kankoboko-cho, Shijodori-Muromachi-Higashiiru, Shimogyo-ku, Kyoto, 600-8009, Japan) DUO track. Scanning Electron Micrographs were obtained with an AMAT (Applied Materials, Inc. 3050 Bowers Avenue, P.O. Box 58039 Santa Clara, Calif. 95054-3299 U.S.A.) SEM. A Hitachi (Hitachi High Technologies America Inc. 10 North Martingale Road, Suite 500 Schaumburg, Ill. 60173-2295) S-5500 was used to examine cross sections SEM of Viarrays produced. Contact angles were measured using a Kyowa (Kyowa Interface Science Co., Ltd. 5-4-41 Nobitome, Niiza-City, Saitama 352-0011, Japan) Interface Science Drop Master DY-700.

Synthesis Example 1: Synthesis of Polystyrene Endcapped with $CH_2CH_2OH$

A single neck 1 L glass reactor was attached with septum adapter which facilities application of $N_2$ and vacuum to the reactor. The reactor was dried using heat-gun under dynamic vacuum and filled with $N_2$. About 600 mL of anhydrous cyclohexane was transferred into the reactor using a stainless steel cannula under $N_2$. Subsequently, 110 mL (99.66 gram) of styrene (degassed and stored under $N_2$) was added into the reactor using $N_2$ purged syringe. Sec-BuLi (1.4M) was added drop-by-drop to quench the impurity in the monomer solution. The titration was performed until a faint honey color persisted in the solution. Immediately, 14.5 mL, 0.020 mole of sec-BuLi (1.4M) was added into the reaction using syringe. The solution turned orange in color. The reaction was kept in a water bath at 45° C. for 4 h. The living polystyryllithium anions were end-capped with ethylene oxide (EO). Purified EO (2 mL), distilled over a small amount of sec-BuLi, and was transferred via cannula into the reactor. The orange color of the living polystyryl lithium disappeared immediately upon addition of EO. Extreme caution should be observed while adding low boiling monomer solution into the reactor kept at 45° C. After the addition, the hot water bath was removed and the end-capping reaction was continued for 2 h at 25° C. The reaction mixture was terminated with 0.5 ml of 1M HCl and an inlet $N_2$ bubbling tube was inserted. Nitrogen was bubbled into the reaction to expel the remaining excess EO into an out-let cannula via septum into a flask containing NaOH solution in water for 15 min. The reaction mixture was diluted with 30 ml of THF and precipitated into an excess ethanol or ethanol with 10% water solution. Polymer was washed with ethanol until the filtrate became neutral and the polymer was dried under vacuum at 55° C. over 10 h. Yield 100%. Mw=5250 and =5021 g/mol.

Synthesis Example 2: Synthesis of Polystyrene Endcapped with $CH_2CH_2$—$OPhCH_2OH$ Under nitrogen gas protection 100 g of polymer made in example 1 dissolved in 95 g of methylene chloride was charged into a 3 L flask. To this was added 30 g of p-toluenesulfonyl chloride dissolved in 240 g of methylene chloride. Under stirring of this solution, 18.3 g of triethylamine was added in a few portions. After the reaction mixture was stirred at room temperature for 24 hrs, the solution was slowly poured into methanol with vigorous stirring. The polymer was isolated by filtering. The polymer was purified by precipitating it first into water and finally into methanol again. The purified polymer was dried in 45° C. vacuum oven until constant weight to obtain 93 g white polymer. Proton NMR showed that OH end-group was successfully converted to OTs.

Under nitrogen protection 5 g of 4-hydroxybenzyl alcohol was dissolved in 95 g of DMF and 32 g of 1 M potassium tert-butoxide in THF was added. After stirring at rt for about 30 min, 23 g of polymer made above dissolved in 80 g of DMF was slowly added. The reaction mixture was stirred at room temperature for 24 hrs. The solution was poured into 1 L of 1:1 (V/V) water/isopropanol with vigorous agitation. The formed polymer was isolated by filtering. The polymer was purified by precipitating in water and finally in isopropanol again. The purified polymer was dried in 50° C. vacuum oven until constant weight to obtain 20 g white polymer. HNMR NMR showed that OTs end-group [OTs group has 2 identifiable peaks: 2.5 ppm for 3H in $CH_3Ph$ and 7.5 ppm for aromatic protons in $CH_3Ph$] was successfully converted to benzyl alcohol (H-1 NMR 2H at 3.6 ppm, —$CH_2CH_2OPhCH_2OH$; 2H at 4.6 ppm, —$CH_2CH_2OPhCH2OH$). The GPC Molecular weight was found to be Mw=5408 and Mn=5153 g/mol, D=1.05.

Comparative Synthesis Example 1 (Azo Initiator with Benzyl Alcohol Group)

(1) A solution was prepared by dissolving with stirring 5.0 g of 4,4'-azobis(4-cyanovaleric acid) in about 100 mL of methanol. To this was added slowly with stirring a solution consisting of an equimolar amount of tetramethylammonium hydroxide pentahydrate in methanol stirring was continued for 30 min after the addition was complete. The solution was then concentrated at room temperature with a rotary-evaporator, and the residue poured into diethyl ether which upon stirring yielded a viscous oil. The oil was turned into a white solid by stirring it in a mixture of diethyl ether and acetone. Drying at room temperature yielded 5.5 g of the ammonium salt of 4,4'-azobis(4-cyanovaleric acid).

(2) A solution was prepared by dissolving 4 g of 4-(chloromethyl)benzyl alcohol in 30 ml of acetone. To this solution was added 5.7 g of sodium iodide dissolved in 25 g acetone. The mixture was stirred at room temperature for 17 hrs. The formed sodium chloride was filtered out. The filtrate was then concentrated to low volume using a rotary evaporator and poured into stirred DI water. The white solid obtained was isolated, washed thoroughly with DI water and dried in a vacuum oven. Yield: 5 g of 4-(iodomethyl)benzyl alcohol.

(3) A solution was prepared by dissolving 4.9 g of 4-(iodomethyl)benzyl alcohol obtained in step (2) in 11 g dimethyl sulfoxide (DMSO). To this solution was added 4.3 g of the ammonium salt prepared in step (1) dissolved in 100 g of DMSO. The reaction mixture was stirred at room temperature for 18 hrs. Tetramethylammonium iodide was filtered off to yield a filtrate. The filtrate was poured into DI water under stirring. The formed solid was filtered, washed thoroughly with water, and dried at room temperature giving 4 g of azo initiator with 2 benzyl alcohol groups, (E)-bis(4-hydroxyphenyl) 4,4'-(diazene-1,2-diyl)bis(4-cyanopentanoate) H-1 (45% yield). H-1 NMR (HOCH2PhCH2OC(O)$CH_2CH_2C(CH3)(CN)N)_2$: 6H at 1.7 ppm, 8H at 2.5 ppm, 4H at 4.6 ppm, 4H at 5.1 ppm and 8H at 7.4 ppm.

Comparative Synthesis Example 2 (Benzyl Alcohol Terminated PS Homopolymer)

A solution was prepared with 1.43 g of the azo initiator prepared in Synthesis Example 1 and 28.6 g of styrene dissolved in 54 g of 2-butanone in a 250 ml flask, equipped with a magnetic bar and cold water condenser. After a nitrogen purge for 30 min, the flask was immersed in an 80° C. oil bath. The polymerization reaction was carried out at that temperature for 18 hrs. The resulting solution was then allowed to cool to room temperature and was precipitated into methanol. The crude polymer was isolated by filtration and purified by dissolving it into 2-butanone and re-precipitating it with methanol. Finally, the isolated polymer was dried in a 50° C. vacuum oven until constant weight (16.4 g) was obtained (57% yield). The polymer was found to have an Mw of 15175 g/mol and a Mn of 9783 g/mol. Characteristic proton peaks assigned to benzyl alcohol end groups (4.6, 5.1 and 7.3 ppm) were clearly seen.

Synthesis Example 3: Synthesis of polystyrene end-capped with tert-butyldimethyl((3-(1-phenylvinyl)benzyl)oxy)silane (3-TBDMPVBOS)

~55 mL of Styrene (column passed and degassed) was taken into a calibrated ampule provided with two Rota flow stopcocks and 19F connecting glass joint. After careful degassing under dynamic vacuum while Styrene kept at low temperature, desired amount of Styrene (55 mL) monomer was collected and ampule was closed under vacuum with stopcock. In the glovebox, the required amount of 3-TBDMPVBOS was weighed (1.2 molar excess with respect to Sec-BuLi) in a vial and dissolved in ~5-10 mL toluene and transferred in a calibrated ampule provided with single Rota flow-stopcock and 19F joint. A dilute Lithium 3-methyl-1,1-diphenylpentan-1-ide solution was prepared by reacting sec-butyl lithium with 1,1-diphenylethane (DPE) in toluene 1 mL of DPE reacted with sec-butyl lithium until a dark color forms. The solution of 3-TBDMPVBOS was promptly titrated with the dilute solution Lithium 3-methyl-1,1-diphenylpentan-1-ide solution until a pale orange/red color was persistence. After closing the stopcock, the ampule was removed from glovebox. Both Styrene ampule and DPE ampule were attached to the flaks using glass joints and yellow grease. Vacuum was applied to the flask and dried using heat-gun. After 10 min flask was brought to RT and filled with argon. Under positive pressure ~600 mL dry THF was transferred to the flask via cannula transfer. The flask temperature was lowered to ~78° C. using a dry ice/acetone bath. THF solution was titrated with Sec-BuLi (1.4M) until a persistent lemon yellow/yellow color was obtained. While the flask was at ~78° C., the styrene ampule was filled with argon, and the pressure equilibrating stopcock was closed. After 5 min, the dry ice/acetone bath was removed and the flask was brought to (room temperature (RT). After 15-30 min, the yellow color/sec-BuLi (complete decay of excess Sec-BuLi was) faded and colorless solution was obtained. After the colorless solution was obtained, flask temperature was lowered to ~78° C. and required amount of sec-BuLi initiator was added using airtight glass syringe. After 2-3 min, while the initiator solution was kept under rapid stirring, Styrene was added dropwise within 3-6 min. The reaction was continued for a further for 30 minutes and terminated with 3 mL degassed methanol. The flask was brought to RT and the polymer was recovered by precipitation into MeOH. The precipitated polymer was filtered and dried in vacuum at 80° C. and gave quantitative yield of 3-TBDMPVBOS endcapped polystyrene (PS).

Deprotection of Tert-Butyldimethylsilyl, (TBDMS) Protecting Group:

To a single neck 500 mL round bottom flask, dried polymer, 3-TBDMPVBOS endcapped polystyrene (PS), was taken and dissolved in ~200 mL anhydrous tetrahydrofuran. The flask was closed with a rubber septum and excess tetrabutylammonium fluoride (TBAF) (1:6) was added via cannula. The reaction was allowed to run at RT for >24 h. After complete deprotection of siloxy groups, (3-(1-phenylvinyl)phenyl)methanol capped polystyrene (PS-DPE-CH$_2$OH) was recovered by precipitation in a large excess of methanol (PS-DPE-CH$_2$OH with M$_n$~5k tends to partially dissolves in methanol, so care must be taken to avoid loss during precipitation. A deionized water/Methanol mixture (1:1) was used to remove any silanol and LiOH bi-products. After filtration, the polymer was dried in a vacuum oven at 80° C. for 24 h, which resulted in a yield of 42 g of white powder like PS-DPE-CH$_2$OH. In proton NMR the disappearance of the characteristic proton peaks assigned to the tert-butydimethysilyl protecting group (−0.9 ppm) was clearly seen.

Comparative Example for FIG. 1

The polymer of "Synthesis Example 2," and the polymer of "Comparative Synthesis Example 2," were separately dissolved in PGMEA to form 2 wt % solutions. These solutions were individually filtered using a Nylon filter (Entegris, Billerica, Ma). These two solution were then separately coated at 1500 rpm on both Si and SiO$_2$ wafers, and the wafers were subsequently each baked at 150° C. for 5 min. Following the bake, the wafers were rinsed with PGMEA for 1 min to remove any un-grafted polymer from the wafer which were then spun dried by spinning "1,500 rpm," followed by baking at 110° C. for 1 min. AFM images of processed substrates for were taken and scanned surface images were shown in FIG. 1. The grafted brush polymer made from "Synthesis Example 2," showed a uniform and dense films on both b) Si and d) SiO2 substrate. In contrast, the wafers treated with the polymer of "Comparative Synthesis Example 2," has non-grafted area (white holes) indicating that the grafted polymer brush film is not uniform on either a) Si and c) SiO$_2$ substrates.

Figures 2A, 2B:
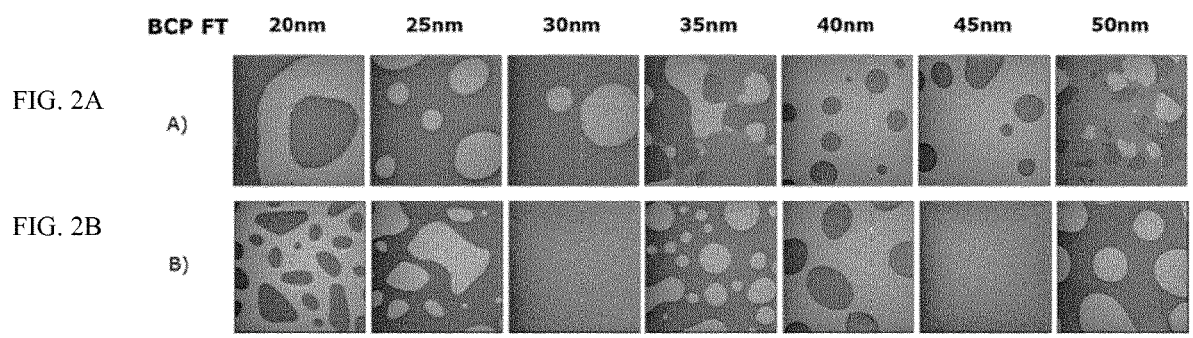

Comparative Example for FIGS. 2 and 2B

Si wafers were coated at 1500 rpm with a Si-antireflective coating (ARC) (SHB A940) obtained from Fujifilm (419 West Avenue Stamford, Conn. 06902) and baked at 220° C. for 90 s, and then the wafers were rinsed with TMAH. Then these ARC coated wafer were individually coated with 2 wt % filtered solutions in PGMEA of either the polymer from "Synthesis example 2," or the polymer from "Comparative Example 2," to get a thickness of 51 nm. After coating, each of these wafers was baked at 160° C. for 5 min, and then rinsed with PGMEA for 1 min, to remove un-grafted styrenic polymer, and this bake was followed by spin drying at 1500 rpm, and baking at 110° C. for 1 min to produce polystyrene grafted wafers. On each of these polystyrene grafted wafers, a block copolymer (BCP) film was coated from the diblock copolymer of methyl methacrylate and (MMA) AZEMBLY EXP PME-190" (EMD Performance Materials, 70 Meister Ave, Branchburg, N.J. 08876, USA) having an Lo of 30 nm and polystyrene Vf~40 to 60%. This material was coating by varying the speed speed during the coating to coat a range of thicknesses (20 nm, 25 nm, 30 nm, 35 nm, 40 nm, 45 nm and 50 nm) These wafers coated with this BCP were then annealed at 250° C. for 5 min under N$_2$ to anneal the block copolymer film. NanoSEM NanoSEM (NanoSEM 3D, Applied Materials, Santa Clara, Calif.) top down images were taken of these different coated and annealed wafers (FIG. 2). In the annealed BCP films having a thickness of 30 nm and 45 nm film thicknesses, parallel morphology was observed (FIG. 2B) on the wafers prepared from the polymer of "Synthesis Example 2) but not with any of the wafers prepared from the polymer of "Comparative Synthesis Example 2," (FIG. 2A). This indicated that the polymer of "Synthesis Example 2," provided a strong consistent surface energy by forming a uniform and dense polymer grafted brush film while brush material from Comparative Synthesis Example 2," did not have a comparable grafted polymer brush film quality. In general, but not bound by theory, when the substrate has a favorable interfacial energy with one domain than the other in di-block copolymer, the interaction between the substrate and favorable domain causes the lamellar to be oriented parallel to the substrate in the thin film instead of perpendicular orientation. This parallel morphology of thin film has three typical structures such as asymmetric, symmetric and, hole and island structure depending on the BCP film thickness and the interfacial energy between the BCP domains and ambient environment (e.g. air or N$_2$). On a substrate grafted with polystyrene (PS) and coated with the BCP and annealed, in N$_2$ atmosphere, it would be expected that both the PS domain and PMMA domain have the same interfacial energy to N$_2$ ambient. Consequently, both PS and PMMA domains can be located at the top surface of the BCP film. FIGS. 2A and 2B, FIGS. 2A and 2B, respectively compares how effectively the BCP having an Lo of 30 nm undergoes self-assembly on substrate which are in 2A grafted PS brush from a polystyrene material having a polydispersity of ~1.7 to in 2B a grafted PS brush from a polystyrene material having a polydispersity of 1.05. Theoretically, for this BCP having a Lo of 30 nm, at BCP film thickness at thicknesses of BCP of 30 nm and 45 nm, there should be symmetric and asymmetric wetting structures while at other BCP film thicknesses hole and Island structures should predominate. However, to sustain this theory, interfacial energy between substrate and PS domain should be sufficiently strong. If not, both PS and PMMA domains will be able to interact with the substrate which doesn't generate perfectly parallel thin film structures at the corresponding film thickness. To achieve this theoretical result, the grafted PS brush regions should have dense and uniform film on the substrate to enable strong consistent interfacial interaction with PS domain of the BCP. In FIG. 2A, with increasing film thickness, the SEM pictures consistently showed always hole and island structure regardless of film thickness changes while FIG. 2B it is clear from the SEM pictures perfectly parallel thin film structures are present. This result indicates that PS brush materials applied in 2B by having a narrow polydispersity provides a dense strong grafted PS grafted surface. On the other hand, in FIG. 2A forms it is evident that using a PS precursor with a high polydispersity yields a poor grafted PS film, since the theoretical parallel orientations indicative of asymmetric and symmetric wetting structures.

We claim:

1. A styrenic polymer, wherein the styrenic polymer has a polydispersity of 1 to 1.1 and further wherein each polymer chain of the styrenic polymer is capped with one end group of structure 1)

1)

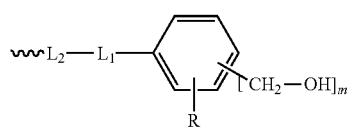

wherein $L_1$ is a linking group selected from the group consisting of a direct valence bond, oxy (—O—), carbonyloxy, (—(C=O)—O—), and carbonate (—O—(C=O)—O—); $L_2$ is selected from the group consisting of a C-1 to C-20 substituted or unsubstituted alkylene spacer, an arylene spacer and a direct valence bond, R is selected from the group consisting of hydrogen, a halide, a C-1 to C-20 alkyl moiety, and a C-1 to C-20 alkyloxy moiety, m is 1 to 3; and ⁓ represents the direct valence bond attaching the end group 1) to the end polymer chain of the styrenic polymer.

2. The styrenic polymer of claim 1 wherein m is 1 or 2.

3. The styrenic polymer of claim 1 wherein the end group has structure 1a)

1a)

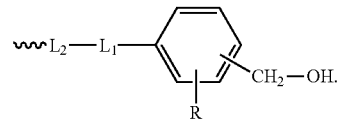

4. The styrenic polymer of claim 1 wherein the end group has structure 1b)

1b)

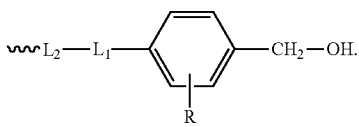

5. The styrenic polymer of claim 1 wherein $L_2$ is a C-1 to C-20 alkylene spacer, $L_1$ is oxy(—O—).

6. The styrenic polymer of claim 1 wherein $L_2$ is a C-2 alkylene spacer, $L_1$ is oxy(—O—).

7. The styrenic polymer of claim 1 where R is hydrogen.

8. The styrenic polymer according of claim 1 where the styrenic polymer has a Mw from 1000 g/mol to 50000 g/mol.

9. The styrenic polymer of claim 1 having structure 3);

3)

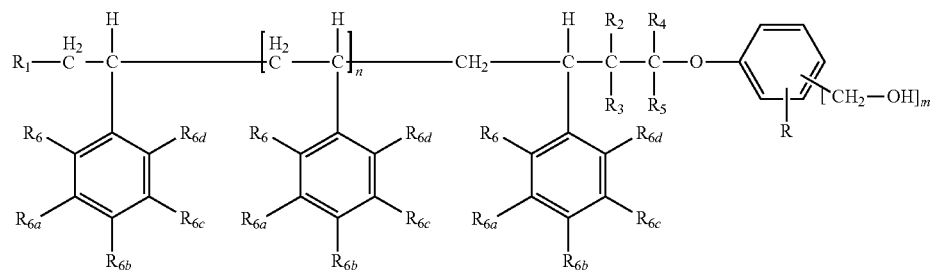

wherein $R_1$ is a C-1 to C-20 alkyl, $R_2$, $R_3$, $R_4$ and $R_5$ are independently selected from the group consisting of hydrogen and a C-1 to C-20, alkyl moiety, $R_6$, $R_{6a}$, $R_{6b}$, $R_{6c}$ and $R_{6d}$ are independently selected from the group consisting of hydrogen, a C-1 to C-20 alkyl, a C-1 to C-20 alkyloxy, a C-1 to C-10 fluoroalkyl, a C-1 to C-10 fluoroalkyloxy, a trialkylsilyl group, a (trialkylsilyl)alkylene group, and a (trialkylsilyl)alkyleneoxy group, R is selected from the group consisting of hydrogen, a halide, a C-1 to C-20 alkyl moiety, and a C-1 to C-20 alkyloxy moiety, n is the number of repeat unit in a polymer chain, and is a non-zero positive integer, and m is an integer from 1 to 3.

10. The styrenic polymer according to claim 9 wherein the styrenic polymer has structure 3a)

3a)
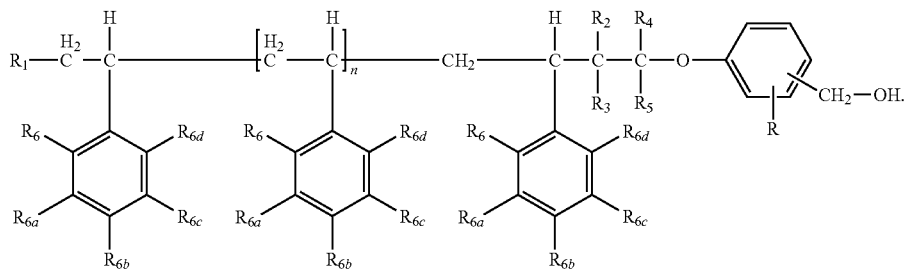

11. The styrenic polymer according to claim 9 where the styrenic polymer has structure 3b)

3b)
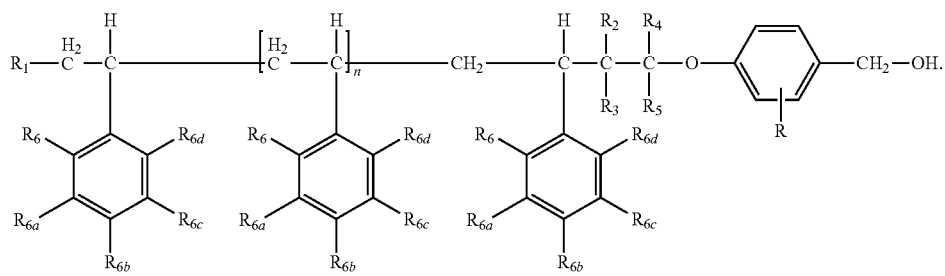

12. The styrenic polymer of claim 1 wherein the end group has structure 1), further wherein $L_1$ is a direct valence bond and $L_2$ is a C-1 to C-20 alkylene spacer which is substituted with an aryl group.

13. The styrenic polymer of claim 1, wherein the end group has structure 2), and further wherein $L_3$ is a C-1 to C-19 alkylene group, R' and R" are independently selected from a halide, a C-1 to C-20 alkyl moiety, and a C-1 to C-20 alkyloxy moiety; and m' is an integer from 1 to 3; and ⁓ represent the direct valence bond attaching, the end group 2), to the end of the polymer chain of the styrenic polymer 2)
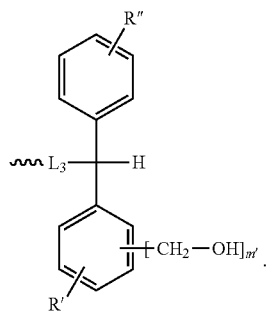

14. The styrenic polymer of claim 1, wherein the end group has structure 2a), and further wherein $L_3$ is a C-1 to C-19 alkylene group, R' and R" are independently selected from a hydrogen, a halide, a C-1 to C-20 alkyl moiety, and a C-1 to C-20 alkyloxy moiety; and m' is an integer from 1 to 3; and ⁓ represent the direct valence bond attaching, the end group 2a), to the end of the polymer chain of the styrenic polymer 2a)
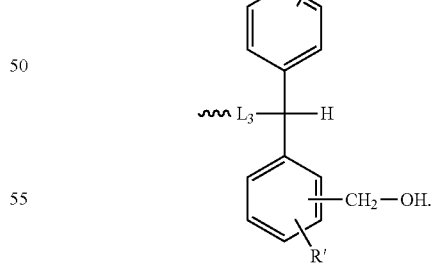

15. The styrenic polymer of claim 1, wherein the end group has structure 2b), and further wherein, $L_3$ is a C-1 to C-19 alkylene group, and ⁓ represent the direct valence bond attaching, the end group 2a), to the end of the polymer chain of the styrenic polymer 2b)

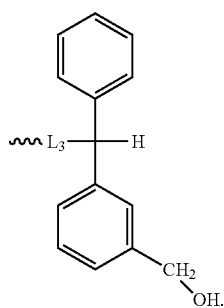

4)

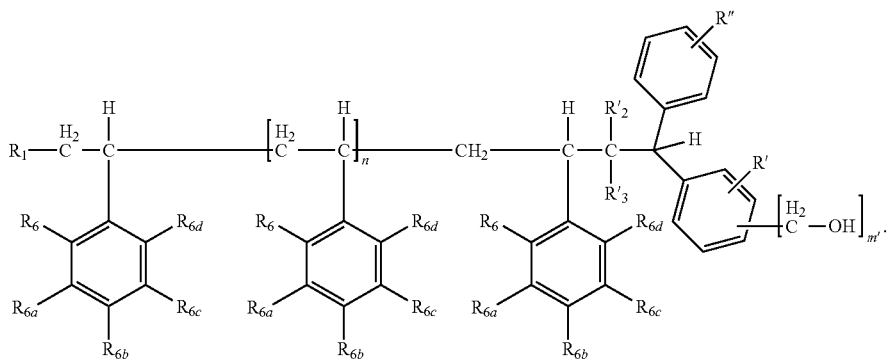

16. The styrenic polymer according to claim 1, wherein the polymer has structure 4), wherein $R_1$ is a C-1 to C-20 alkyl, $R'_2$, $R'_3$, are independently selected from hydrogen or a C-1 to C-20 alkyl moiety, $R_6$, $R_{6a}$, $R_{6b}$, $R_{6c}$ and $R_{6d}$ are independently selected from the group consisting of hydrogen, a C-1 to C-20 alkyl, a C-1 to C-20 alkyloxy, a C-1 to C-10 fluoroalkyl, a C-1 to C-10 fluoroalkyloxy, a trialkylsilyl group, a (trialkylsilyl)alkylene group, and a (trialkylsilyl)alkyleneoxy group, R' is selected from the group consisting of hydrogen, a halide, a C-1 to C-20 alkyl moiety, and a C-1 to C-20 alkyloxy moiety, n is the number of repeat unit in a polymer chain, and is a non-zero positive integer, n is the number of repeat unit in a polymer chain, and m' is an integer from 1 to 3.

17. The styrenic polymer according to claim 1, wherein the polymer has structure 4a), wherein $R_1$ is a C-1 to C-20 alkyl, $R'_2$, $R'_3$, are independently selected from hydrogen or a C-1 to C-20 alkyl moiety, $R_6$, $R_{6a}$, $R_{6b}$, $R_{6c}$ and $R_{6d}$ are independently selected from the group consisting of hydrogen, a C-1 to C-20 alkyl, a C-1 to C-20 alkyloxy, a C-1 to C-10 fluoroalkyl, a C-1 to C-10 fluoroalkyloxy, a trialkylsilyl group, a (trialkylsilyl)alkylene group, and a (trialkylsilyl)alkyleneoxy group, R' is selected from the group consisting of hydrogen, a halide, a C-1 to C-20 alkyl moiety, and a C-1 to C-20 alkyloxy moiety, n is the number of repeat unit in a polymer chain, and is a non-zero positive integer 4a)

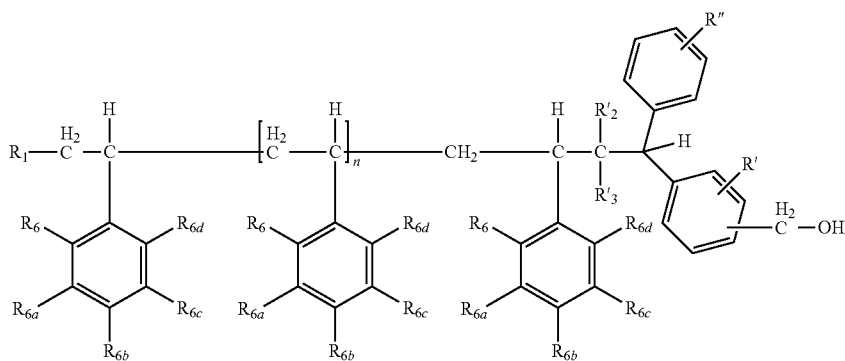

18. The styrenic polymer according to claim 1, wherein the polymer has structure 4b), wherein $R_1$ is a C-1 to C-20 alkyl, $R'_2$, $R'_3$, are independently selected from hydrogen or a C-1 to C-20 alkyl moiety, $R_6$, $R_{6a}$, $R_{6b}$, $R_{6c}$ and $R_{6d}$ are independently selected from the group consisting of hydrogen, a C-1 to C-20 alkyl, a C-1 to C-20 alkyloxy, a C-1 to C-10 fluoroalkyl, a C-1 to C-10 fluoroalkyloxy, a trialkylsilyl group, a (trialkylsilyl)alkylene group, and a (trialkylsilyl)alkyleneoxy group, R' and R" are independently selected from the group consisting of hydrogen, a halide, a C-1 to C-20 alkyl moiety, and a C-1 to C-20 alkyloxy moiety, n is the number of repeat unit in a polymer chain, and is a non-zero positive integer 4b)

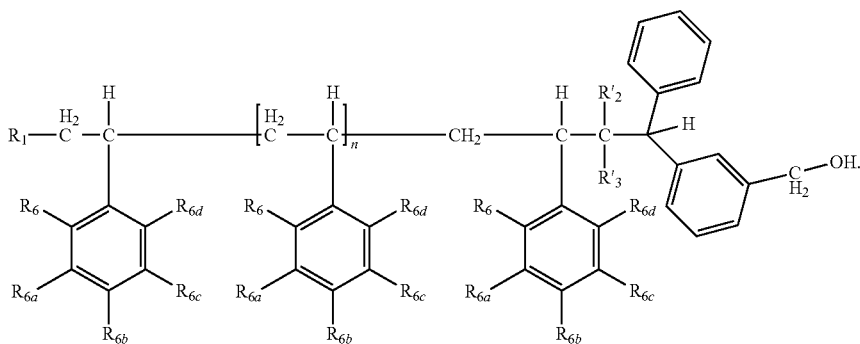

19. A composition which is comprised of a styrenic polymer of claim 1 and a solvent.

20. The composition of claim 19 further comprising a thermal acid generator.

21. A process of grafting a pinning layer on a substrate comprised of steps:
   coating the substrate with the composition of claim 19 to form a coated layer;
   heating the coated layer at a temperature from 140° C. to 170° C. to affect grafting; and
   treating the heated coated layer with an organic solvent to remove ungrafted polymer, leaving an insoluble grafted pinning layer on the substrate.

22. A process of chemoepitaxy, directed self-assembly of a block copolymer layer used to form an image comprised of the steps:
   coating a substrate with a graftable neutral layer polymer precursor to form a coated layer 1;
   heating coated layer 1 at a temperature from 90° C. to 180° C. to remove solvent;
   heating the coated layer 1 after step b1) at a temperature from 200° C. to 300° C. to affect grafting;
   treating the coated layer 1 after step c1) with an organic solvent to remove ungrafted neutral layer polymer, leaving an insoluble grafted neutral layer on the substrate;
   coating a photoresist layer over the grafted neutral layer;
   forming a negative pattern in the photoresist layer, thereby forming regions in which the grafted neutral layer is covered or uncovered by the resist, where the pattern in the resist is comprised of both small nanometer sized repeating patterns and also large areas of resist removed during the imaging process containing no repeating nanometer sized patterns;
   etching to remove the neutral layer regions uncovered in step f1) leaving bare substrate in these regions;
   stripping the resist away from the substrate after step g1), leaving a patterned substrate in which regions of substrate left uncovered by resist in step f1) are free of a grafted neutral layer and the regions covered by resist in step f1) retain the grafted neutral layer;
   coating the patterned substrate with the composition of claim 19 to form a coated layer 2;
   heating the coated layer 2 a temperature from 120° C. to 190° C.;
   treating the coated layer 2 after heating step j1) with an organic solvent to remove ungrafted polymer, leaving an insoluble grafted pinning layer material on the substrate in the regions free of grafted neutral layer creating a substrate with both pinning layer areas and neutral layer areas;
   applying a coating of a block copolymer comprising an etch resistant styrenic block and a highly etchable aliphatic block over the substrate containing a patterned neutral layer and pinning layer, creating a substrate containing both a patterned neutral layer and a patterned pinning layer;
   annealing the block copolymer layer until directed self-assembly occurs in the small nanometer sized repeating patterns of the substrate, but where no perpendicular orientation of block polymer domains occurs in the large areas containing grafted pinning layer;
   etching the block copolymer, thereby removing the highly etchable block of the copolymer and forming a repeating nanometer sized pattern in the areas where directed self-assembly of the block copolymer occurred on the substrate in step m1).

23. A process of chemoepitaxy, directed self-assembly of a block copolymer layer used to form an image comprised of the steps:
   forming a coating of a neutral layer polymer precursor which is crosslinkable or which is both crosslinkable and graftable on a substrate;
   heating the neutral polymer layer precursor coating which is crosslinkable or the precursor coating which is both crosslinkable and graftable at a temperature from 90° C. to 180° C. to remove solvent;
   heating the neutral layer polymer precursor coating which is crosslinkable or the coating precursor coating which is both crosslinkable and graftable at a temperature from 200° C. to 300° C. to form a crosslinked neutral layer or a crosslinked and grafted neutral layer;
   providing a coating of a photoresist layer over the crosslinked neutral layer or over the crosslinked and grafted neutral layer;

forming a negative pattern in the photoresist layer, thereby forming regions in which the crosslinked or the crosslinked and grafted neutral layer is covered or uncovered by the resist, where the pattern in the resist is comprised of both small nanometer repeating patterns and also large areas of resist removed during the imaging process containing no repeating nanometer sized patterns;

a2) etching with a plasma to remove in the neutral layer regions uncovered in step e2) removing crosslinked or crosslinked and grafted neutral layer leaving bare substrate in the regions uncovered in step e2);

b2) stripping the resist away from the substrate after step f2), leaving a patterned substrate in which regions of substrate left uncovered by resist in step e2) are free of a crosslinked or crosslinked and grafted neutral layer and the regions covered by resist in step f2) retain the crosslinked or crosslinked and grafted neutral layer;

c2) coating the patterned substrate with the composition of claim 19 to form a coated layer;

d2) heating the coated layer at a temperature from 120° C. to 190° C.;

e2) treating the coated layer after heating step i2) with an organic solvent to remove ungrafted polymer, leaving an insoluble crosslinked or crosslinked and grafted pinning layer material on the substrate in the regions free of crosslinked neutral layer or free of crosslinked and grafted neutral layer, creating a substrate containing both a patterned neutral layer and a patterned pinning layer;

f2) applying a coating of a block copolymer comprising an etch resistant styrenic block and a highly etchable aliphatic block over the substrate containing a patterned neutral layer and pinning layer;

g2) annealing the block copolymer layer until directed self-assembly occurs in the small nanometer sized repeating patterns of the substrate, but where no perpendicular orientation of block polymer domains occurs in the large areas containing grafted pinning layer;

h2) etching the block copolymer, thereby removing the highly etchable block of the copolymer and forming a repeating nanometer sized pattern in the areas where directed self-assembly of the block copolymer occurred on the substrate in step l2).

* * * * *